United States Patent [19]

Koveshnikov et al.

[11] Patent Number: 5,943,552
[45] Date of Patent: Aug. 24, 1999

[54] SCHOTTKY METAL DETECTION METHOD

[75] Inventors: Sergei Viktor Koveshnikov; Howard Mollenkopf, both of Vancouver, Wash.

[73] Assignee: SEH America, Inc., Vancouver, Wash.

[21] Appl. No.: 08/796,137

[22] Filed: Feb. 6, 1997

[51] Int. Cl.$^6$ .................................................. H01L 21/66
[52] U.S. Cl. ............................................. 438/17; 438/104
[58] Field of Search ................................ 438/17, 14, 15, 438/16, 104, 105, 106; 324/158; 357/30; 250/338.1

[56] References Cited

U.S. PATENT DOCUMENTS 5,298,860  3/1994  Kato ........................................ 324/158

OTHER PUBLICATIONS

International Search Report regarding International Application No. PCT/US 98/02038.
Heiser T et al.: "Transient io drift detection of low level copper contamination in silicon" Applied Physics Letters, vol. 70, No. 26, Jun. 30, 1997, pp. 3576–3578.
Heiser T. et al.: "Low Level Cu Contamination of Silicon during wet cleaning studied by transient ion drift" Defects and Diffusion in Silicon Processing Symposium, Mat. Res. Soc., vol. 469, Apr. 1–4, 1997, pp. 475–480.
Zamouche A et al: "Investigation of fast diffusing impurities in silicon by a transient ion drift method" Applied Physics Letters, vol. 66, No. 5, Jan. 30, 1995, pp. 631–633.
Heister T et al: "Determination of the Copper Diffusion Coefficient in Silicon from Transient Ion–Drift" Applied Physics A. Solids and Surfaces, vol. A57, No. 4, Oct. 1993, pp. 325–238.
Aboelfotoh M O et al: "Copper Passivation of boron in silicon and boron reactivation kinetics" Physical Review, B. Condensed Matter, vol. 44, No. 23, Dec. 15, 1991, pp. 12742–12747.
Beyer K D et al: "Schottky Barrier Diode for Substrate Evaluation" IBM Technical Disclosure Bulletin, vol. 19, No. 6, Nov. 1976, p. 2045.

Stavrev M et al: "Study of Ta(N,O) diffusion barrier stability: analytical and electrical characterization of low level CU contamination in Si" Microelectronic Engineering, vol. 37–38, Nov. 1997, pp. 245–251.
K. Graff, *Metal Impurities In Silicon–Device Fabrication*, 1995, pp. 83–89.
C.S. Fuller, J.C. Severiens, *Mobility of Impurity Ions In Germanium And Silicon*, Physical Review, vol. 96, No. 1, Oct. 1, 1954, pp. 21–24.
L.C. Kimerling, J.L. Benton, J.J. Rubin, *Transition Metal Impurities In Silicon*, The Institute Of Physics, Chapter 4, 1980, pp. 217–223.
S.M. Sze, *Depletion Region And Depletion Capacitance*, Physics Of Semiconductor Devices, Second Edition, 1981, pp. 79–81.
K. Graff, H. Pieper, *The Properties Of Iron In Silicon*, J. Electrochem. Soc.: Solid–State Science And Technology, vol. 128, No. 3, Mar. 1981, pp. 669–674.
Eicke R. Weber, *Transition Metals In Silicon*, Applied Physics A 30, 1983, pp. 1–22.
Howard R. Huff, Keith G. Barraclough, Editors, *Semiconductor Silicon 1990, Proceedings Of The Sixth International Symposium On Silicon Materials Science and Technology*, 1990. pp. 1016–1029.
Dieter, K. Schroder, *Semicondutor Material And Device Characterization*, 1990, pp. 84–89 and 514–545.
W. Schroeter, M. Siebt, D. Gilles, *Electronic Structure And Properties Of Semiconductors*, 1991, pp. 539–589.

(List continued on next page.)

*Primary Examiner*—Chandra Chaudhari
*Assistant Examiner*—Craig Thompson
*Attorney, Agent, or Firm*—Alston & Bird LLP

[57] ABSTRACT

A novel and highly sensitive method for detecting various transition metals at the surface and subsurface region of single-crystal silicon wafers by capacitance-voltage measurement of reverse-biased Schottky diodes at elevated temperatures.

24 Claims, 17 Drawing Sheets

OTHER PUBLICATIONS

Howard E. Taylor, John R. Garbarino, *Analytical Applications Of Inductively Coupled Plasma–Mass Spectrometry, Inductively Coupled Plasmas In Analytical Atomic Spectrometry*, Second Edtion, 1992, pp. 651–673.

A. Mesli, T. Heiser, *Defect Reactions In Copper–Diffused And Quenched p–Type Silicon, The American Physical Society*, vol. 45, No. 20, May 15, 1992, pp. 11 632–641.

M. Saritas, A.R. Peaker, *Deep States Associated With Oxidation Induced Stacking Faults In RTA p–Type Silicon Before And After Copper Diffusion, Solid–State Electronics*, vol. 38, No. 5, 1995, pp. 1025–1034.

K. Graff, *Metal Impurities In Silicon–Device Fabrication*, 1995, pp. 132–153.

"Deposition Characteristics of Metal Contaminants from HP–Based Process Solutions onto Silicon Wafer Surfaces", Eugene Hsu, et al., *J. Electrochem Soc.*, vol. 139, No. 12, Dec. 1992, pp. 3659–3664.

"Deposition of Copper from a Buffered Oxide Etchant onto Silicon Wafers", Keith K. Yoneshige, et al., *J. Electrochem Soc.*, vol. 142, No. 2, Feb. 1995, pp. 671–675.

"Copper passivation of boron in silicon and boron reactivation kinetics", M. O. Aboelfotoh, et al., *Physical Review B*, vol. 44, No. 23, Dec. 15, 1991, pp. 742–747.

"Deep levels of copper in silicon", S. D. Brotherton, et al., *J. Appl. Phys.*, vol. 62, No. 5, Sep. 1, 1987, pp. 1826–1832.

"Correlation between the Cu–related luminescent center and a deep level in silicon", H. B. Erzgräber, et al., *J. Appl. Phys.*, vol. 78, No. 6, Sep. 15, 1995, pp. 4066–4068.

"Surface copper contamination of as–received float–zone silicon wafers", L. T. Canham, et al., *J. Appl. Phys.*, vol. 66, No. 2, Jul. 15, 1989, pp. 920–927.

"Copper, lithium, and hydrogen passivation of boron in c–Si", Stefan K. Estreicher, *Physical Review B*, vol. 41, No. 8, Mar. 15, 1990, pp. 5447–5450.

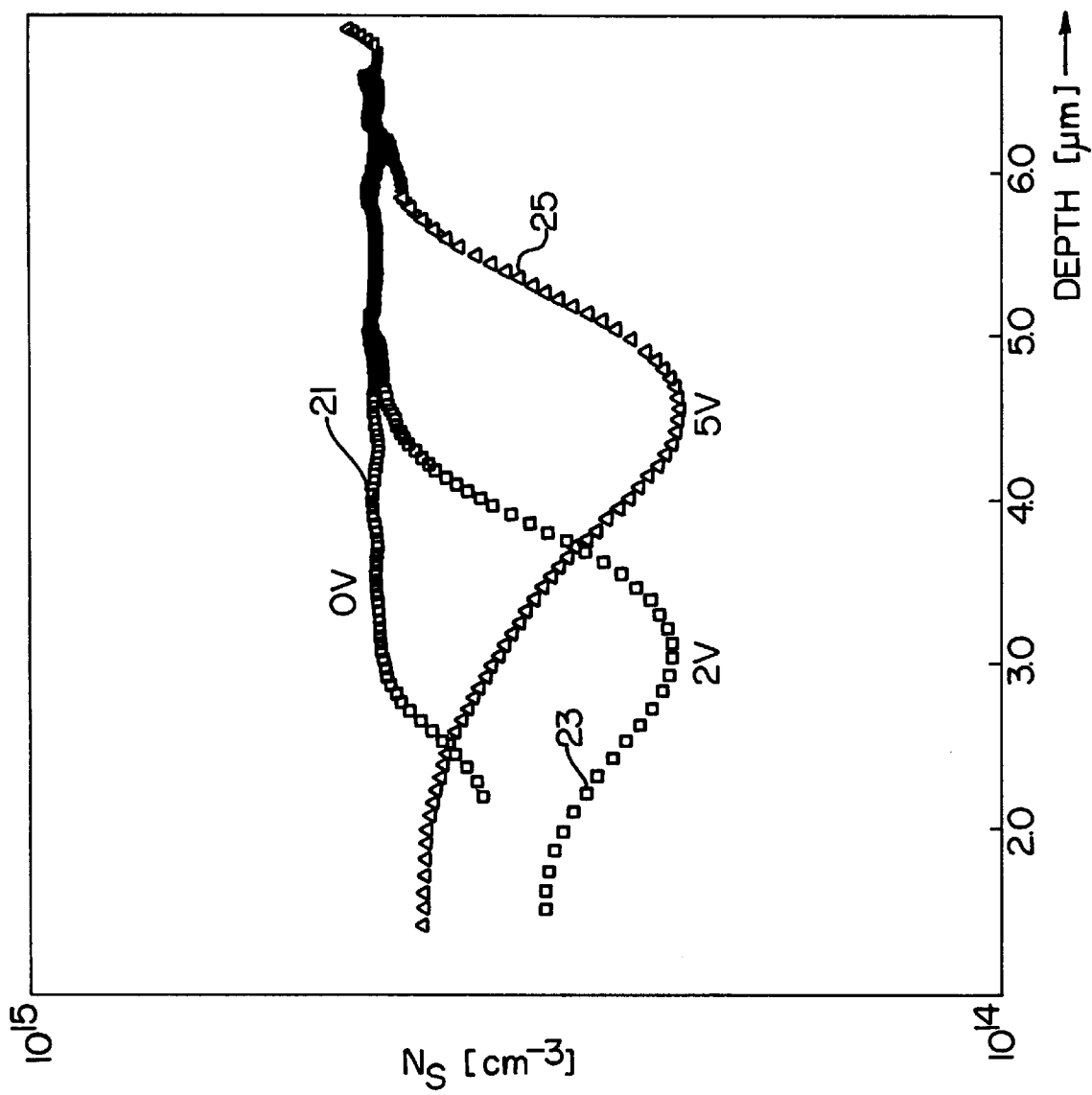

SCHOTTKY METAL DETECTION METHOD

BACKGROUND OF THE INVENTION

1. Area of the Art

The present invention relates to the field of manufacture of semiconductor wafers. More particularly, the present invention relates to the field of detecting transition metal impurities in the manufacturing process of semiconductor wafers.

2. Description of the Prior Art

Transition metal impurities, even at relatively low concentrations, affect device yields, performance and reliability. Metal contaminations can be introduced by process chemicals, materials, equipment and environments.

There has been a continuous effort to reduce the levels of metal contaminations and the latest requirements calls for a reduction of metallic impurity levels to be below surface concentrations of $10^9 cm^{-2}$. It is necessary not only to monitor and purify process chemicals and materials, but also to verify the quantity of unwanted impurities that are contaminating the surface of the silicon wafers and the bulk of such wafers.

These requirements demand measurement methods of ever increasing sensitivity to reduce detection limits well below certain defined values (e.g., specified values, target values and the like). Unfortunately, many known measurement methods in this field are either slow, expensive, not sensitive enough, or have any combination of these shortcomings.

Currently there are two major groups of existing methods which have been used for analysis of surface contamination and near-surface region contamination of silicon wafers. The first group includes chemical analytical methods to determine total impurity concentrations. The second one consists of indirect measurement techniques dealing with dissolved and electrically active or optically active impurity fractions.

The first group of existing measurement methods involves direct detection of copper (Cu) on the silicon surface and near-surface region by analytical techniques. Examples of such direct detection methods include energy dispersed x-ray analysis (EDX) for detecting copper in a heavily contaminated silicon surface (useful when the number of copper atoms is a few percent of the number of silicon atoms), secondary ion mass spectrometry (SIMS) for detecting surface concentrations of about $10^{12} cm^{-2}$ of copper, Auger spectroscopy for detecting surface concentrations of about $10^{13} cm^{-2}$ of copper, total reflection x-ray fluorescence analysis (TRXF) or inductively coupled plasma mass spectroscopy (ICP-MS) for detecting surface concentrations of about $10^{10} cm^{-2}$ of copper.

The second group of existing measurement methods involves indirect detection of copper surface contamination via electrical or optical characterization of copper in the bulk silicon after high-temperature annealing. Examples of such indirect detection methods utilizing electrical analysis include deep level transient spectroscopy (DLTS) and surface photo voltage (SPV). Examples of such indirect detection methods utilizing optical analysis include photoluminescence (PL) analysis of the copper-related defects. In order to evaluate the surface contamination, the copper impurity must first be driven into the wafer bulk. This can be done either by conventional furnace annealing followed by sample quenching, or by rapid thermal annealing. The bulk concentration of copper-related defects is then re-calculated as a surface density.

The main disadvantage of the methods in the first group is the low sensitivity for detection of copper. Only total reflection x-ray fluorescence and inductively coupled plasma mass spectroscopy can be used for characterization of low surface contamination. However, these techniques cannot provide lateral analysis (resolution of the total reflection x-ray fluorescence is about 1 $cm^2$) or in-depth analysis. The latter limitation is particularly important since copper is known to diffuse even at room temperature. In addition, the analysis of contamination by these techniques is time consuming, requires expensive equipment, and therefore is not suitable for the purpose of routine measurements.

The main disadvantage of the methods in the second group is that they require a high-temperature processing step. This can cause some significant errors in calculations of the copper concentrations. There are two fundamental sources for errors. First, high-temperature annealing can release copper impurities, which might have accumulated in the wafer during previous wafer/device processing. In this case, the surface contamination might be overestimated. Second, by being driven deep into the silicon bulk at high temperature, the copper impurity may be captured by gettering sites in the bulk or even at the back wafer surface. In epitaxial silicon wafers, copper may be effectively gettered in highly doped Czochralski silicon substrates containing a high density of crystal defects. In this case, the surface contamination appears to be significantly underestimated. Moreover, since copper strongly tends to precipitate during sample cooling, the cooling rate should be very high in order to detect copperrelated defects by deep level transient spectroscopy. However, even after a rapid quench, the fraction of electrically active copper is known to be of $10^{-4}$ to $10^{-2}$ of the total copper concentration.

Therefore, it is highly desirable to create methods for rapid and highly sensitive detection of transition metal contamination on the surface and in the subsurface region of single-crystal silicon wafers.

SUMMARY OF THE INVENTION

Accordingly, it is an object of the present invention to provide novel highly sensitive methods for solving the above-mentioned problems. In particular, it is an object of the present invention to provide novel methods for rapid and highly sensitive detection of transition metal contamination on the surface and in the subsurface region of single-crystal silicon wafers.

These and other objects and advantages are achieved by methods for detecting at least one transition metal at a surface and in a subsurface region of silicon wafers by means of capacitance-voltage (C-V) measurement of reverse-biased Schottky diodes at elevated temperatures.

The novel methods of the present invention provide a number of advantages, allowing a high sensitivity for trace metal detection, providing lateral, as well as in-depth analysis, much faster than conventional methods, and at a much lower cost. Commercially available inexpensive equipment may be used. The novel methods of the present invention also provide for highly accurate quantitative analyses. The possible impact of the high-temperature processing is also excluded.

The present invention methods are also compatible with other techniques for rapid wafer/device characterization used in the wafer production line (e.g., determination of shallow acceptor depth profiles after epitaxial deposition).

The present invention methods further allow fast and sensitive analysis of copper contamination and possibly other transition metals on silicon wafers at multiple stages of wafer and device processing, enabling a fast feed-back on possible process or chemical contamination during manufacturing of single-crystal silicon wafers or devices and the possibility of preventing severe yield loss due to such contaminations.

The novel methods of present invention are well suited for use in connection with manufacturing either silicon polished/epitaxial wafers or silicon-based integrated circuits and devices. The methods allow rapid detection of a particular transition metal with high sensitivity at various technological steps of both wafer and device processing. In such uses of the detection methods in embodiments of the present invention, at least one Schottky diode is deposited on a single-crystal silicon wafer. At elevated temperatures under reverse-bias conditions, the particular transitional metal will be driven from the wafer surface to the near-surface region, and then capacitance-voltage measurement of the reverse-biased Schottky diode at elevated temperatures is performed for calculating the concentration of the particular transition metal.

Further benefits and advantages of the present invention will become apparent from consideration of the following detailed description given with reference to the accompanying drawings, which specify and show preferred embodiments of the present invention.

DESCRIPTION OF THE FIGURES

FIG. 6 Experimentally observed changes of the active boron depth profiles after bias annealing at 110° C. for 5 min. Note that under 2 V bias annealing significant amounts of copper remained near the surface.

DETAILED DESCRIPTION OF THE INVENTION

Figure 1A:
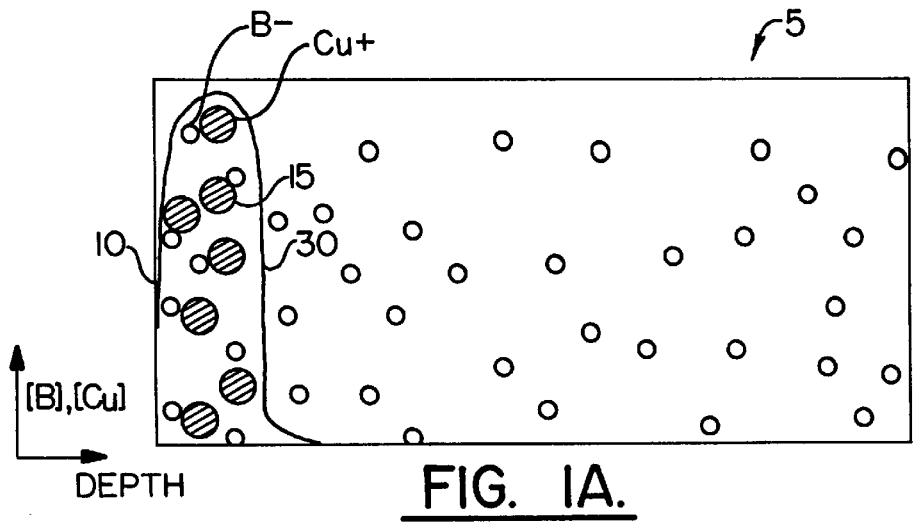
FIGS. 1A–C Schematic presentation of copper diffusion near room temperature driven by the impurity concentration gradient. Effect of boron passivation due to the reaction $Cu^+ + B^- = (CuB)^0$ is also shown.

The present invention provides novel methods for a rapid and highly sensitive detection of transition metal contamination on the surface and in the subsurface region of single-crystal silicon wafers by means of capacitance-voltage measurement of reverse-biased Schottky diodes at elevated temperatures.

In preferred embodiments of the present invention, low-level copper contamination (surface concentrations of from $10^9 cm^{-2}$ to $10^{11} cm^{-2}$) can be rapidly detected on the surface and in near-surface regions of p-type silicon, non-polished, polished and epitaxial wafers. Depth-dependent measurements coupled with the possibility of monitoring a copper lateral distribution across the wafer provide 3-dimensional contamination mapping. These methods allow a rapid control of a silicon wafer surface contamination wherein copper is introduced by various wafer and device processing steps, such as wet and dry chemical treatments, Czochralski silicon wafer processing (i.e., lapping, polishing and the like), or epitaxial-layer deposition and post-epitaxial treatments. These methods may also be used to estimate the level of the copper content in various chemical liquids such as hydrofluoric acid (HF), de-ionized (DI) water and the like. In this case a high purity silicon wafer surface can be used as a monitor for metallic contamination. Finally, these methods help to determine how effective wafer cleaning solutions are.

Elements diffuse within solids at any temperature above absolute zero (−273.15° C.). The speed of such diffusion varies greatly depending on the temperatures involved, the individual diffusion coefficients and the impurity concentrations. The diffusion coefficients themselves vary depending on the elements involved. Copper is the fastest diffusing transition metal in single-crystal silicon and can travel long distances even near room temperatures. Interstitial (unpaired) copper in single-crystal silicon is electrically positively charged and will interact with other electrically charged impurities, for example with negatively charged boron ($B^-$) acceptors or substitutional copper atoms to form $Cu_i$—$B_s$ or $Cu_i$—$Cu_s$ pairs, respectively, where $Cu_i$ stands for interstitial copper atoms; $Cu_s$ stands for substitutional copper atoms; $B_s$ stands for substitutional boron acceptors. Electrically charged particles will also interact with external electric fields.

Considering these facts, copper as an impurity in boron-doped p-type single-crystal silicon was chosen as the subject transition metal in preferred embodiments of the present invention. However, it should be noted that other electrically active interstitial elements, such as nickel (Ni) and iron (Fe) under the right temperatures, applied times and biases may react in a similar manner.

In preferred embodiments of the present invention method, Schottky diodes are deposited on single-crystal silicon wafers. The methods of deposition of Schottky diodes include, but are not limited to, metal evaporation through masks or via sputtering and photolithography. The wafers are then placed on a prober chuck that is capable of heating the specimen to desired temperatures. The wafers have to be free of any electrically isolating films that may have been deposited on the back side. At a certain resistivity value, ohmic contact may be required and should be applied to the wafer back side. The ohmic contact could be by means of gold (Au) deposition, but is not limited to this method.

At elevated temperatures under reversed-bias conditions, the copper contamination will be driven from the wafer surface to the near-surface region, where a copper supersaturation occurs at a certain depth determined by the width of the space charge region. A space charge region is a region below the Schottky contact which is free of charge carriers (i.e., holes in p-type silicon) due, e.g., to an applied electric field. This supersaturation, or trapping of copper, occurs due to copper-boron pair interactions at the edge of the space charge region where the copper may then be detected via passivation of shallow acceptors. A shallow acceptor is an acceptor-like impurity (such as boron) with a shallow level within the silicon bandgap. The bandgap, $E_g$, is the energy region between the edges of the valence band and the conduction band. No electronic states or energy levels exist in the bandgap in the absence of impurities or defects or the like. The method of detection in this case is the widely known capacitance-voltage method, where the differential capacitance of a depletion layer, in this case formed by a Schottky barrier, is used to determine the majority carrier concentration profile (the acceptor concentration profile in the depletion layer of a p-type silicon wafer, for example) as the space charge region width is changed by a reverse bias voltage.

Supersaturation of copper leads also to the formation of small precipitates, such as copper—copper (Cu—Cu) pairs. These defects are known to be electrically active and can be detected by deep level transient spectroscopy.

The present invention relates to the discovery of quantifiable copper-boron pair association and dissociation rates as a function of temperature, the observation for the first time of the formation of copper—copper pairs near room temperature, and the experimental verification of the quadratic dependence of the copper—copper pair concentration on the total copper concentration.

According to the present invention, the fundamental properties of copper in silicon near room temperature such as copper diffusivity, pair dissociation and re-association kinetics for both copper-boron pairs and copper—copper pairs may be determined. The thermal budget required for bias annealing in order to incorporate only the copper impurity may also be determined. The present invention also involves a bias annealing procedure to drive the copper into the wafer and to place the copper at a desired depth, providing thereby a local "supersaturation", such that the copper may be easily detected via passivation of boron. Finally, based on the above discoveries, a procedure for 3-dimensional copper distribution with high in-depth and lateral resolution has been developed.

The preferred embodiments of the present invention involve novel procedures which allow a direct transfer of the copper impurity from the surface of the wafer into a narrow substrate layer (about 1 $\mu$m in thickness) near room temperature, such that a local copper supersaturation can be easily detected by conventional capacitance-voltage and deep level transient spectroscopy measurements. Both fundamental and technical aspects of these novel procedures will be described and discussed in detail below.

1. Fundamental Properties of Copper

The fundamental properties of copper include:

(1) Diffusivity

Copper is the fastest impurity among the transition metals in silicon. Even near room temperature, copper can diffuse over long-range distances.

(2) Solubility

The solid solubility of copper in silicon strongly depends on temperature and shallow acceptor concentration. Near room temperature, copper can be incorporated into silicon in significant concentrations.

(3) Charge State

Interstitial copper is known to be a single, positively charged species which interact with negatively charged acceptors (e.g., negatively charged boron) forming neutral copper-boron pairs.

(4) Electronic States

Copper-related defects introduce a number of deep levels into the silicon bandgap as revealed by deep level transient spectroscopy on heat-treated, copper-contaminated silicon. The most reliably identified signature of copper in silicon is the level at $E_v+0.095\pm0.005$ eV (where $E_v$ is the energy level of the top of the valence band), which has been attributed to $Cu_s$—$Cu_i$ pair defects, where $Cu_s$ stands for substitutional copper atoms, and $Cu_i$ stands for interstitial copper atoms.

(5) Optical Properties

Photoluminescence studies revealed specific photoluminescence lines which serve as an optical signature of copper in silicon.

2. Features of the Copper Impurity Discovered in Embodiments of the Present Invention P-type Czochralski and epitaxial silicon wafers were intentionally contaminated with copper at room temperature via immersion of the wafers into copper-contaminated HF acid. The copper was driven into the near-surface region during thermal annealing at about 20° C. to about 200° C. The copper diffusion profiles were investigated via changes in the active boron concentration as measured by the capacitance-voltage method on Schottky diodes fabricated by deposition of aluminum (Al) or samarium (Sm). By taking advantage of interstitial copper as a single, positively charged species, the process of copper drift in an electric field of a Schottky diode was investigated. The electronic properties of the copper-related traps, which were introduced into the silicon bandgap near room temperature, were investigated in detail by using deep level transient spectroscopy methods. The experimental data described below are relevant to aspects of embodiments of the present invention.

(1) Solubility and Diffusion of Copper Near Room Temperature

A pronounced decrease of the electrically active boron concentration near the wafer surface was observed after 1 hour annealing at temperatures higher than about 70° C. The shallow acceptor depth profiles were obtained from capacitance-voltage measurements by using the standard relation:

$$d(C^{-2})/dV_R = 2/[qA^2\epsilon_s N_A(X)] \tag{1}$$

where C is the Schottky diode capacitance;

A is the Schottky diode area;

$V_R$ is the reverse bias voltage;

q is the elementary charge (e.g., of an electron);

$\epsilon_s$ is the permittivity of silicon; and $N_A(x)$ is the concentration of electrically active boron at a depth x below the surface of the silicon wafer.

The depth of boron passivation increases, while a total loss of electrically active boron decreases, with decreasing initial boron concentration. This result is in good agreement with existing data, and indicates the impact of the boron concentration on the solubility of copper. A notable copper redistribution, which is derived from the changes of the shallow acceptor profiles, can be observed after annealing for a short time of about 5 min at 100° C.

Figure 1B:
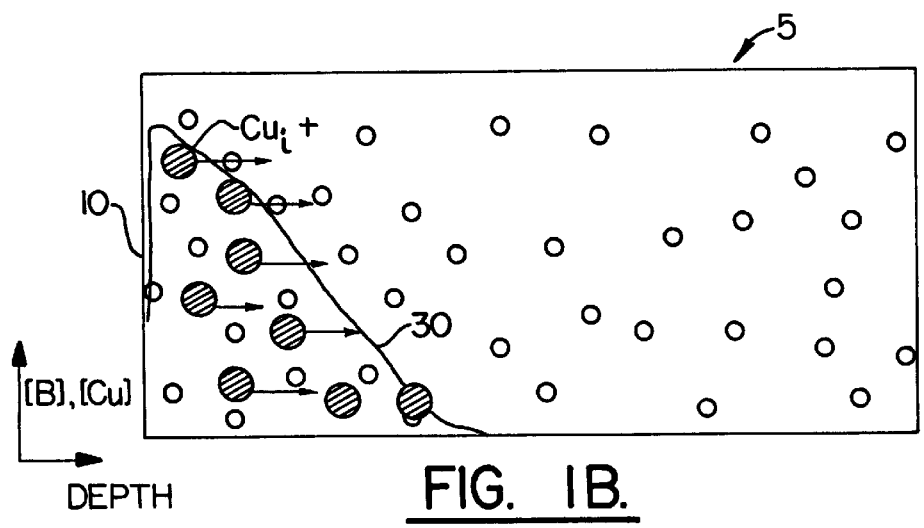
Figure 1C:
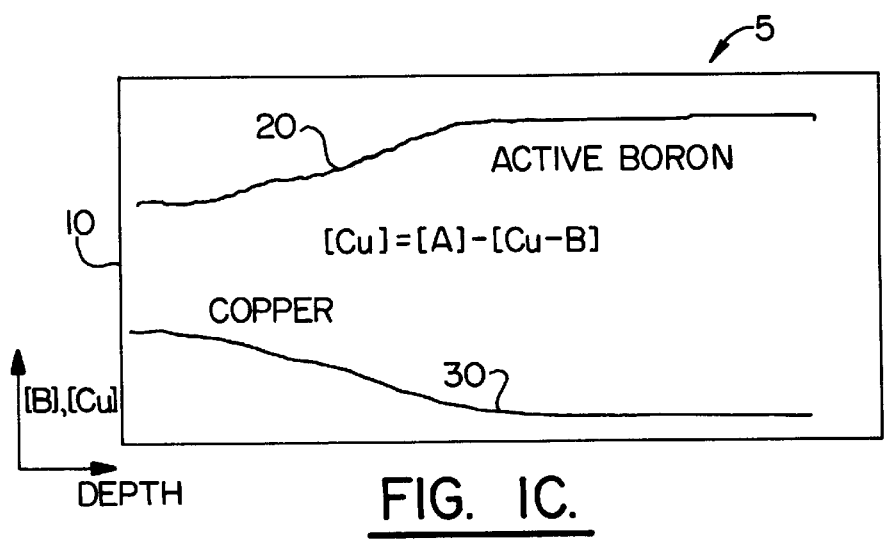

FIGS. 1A–1C show schematic cross-sectional views of a silicon wafer 5, with the depth from the surface 10 of the wafer 5 increasing from left to right along the abscissa, while simultaneously schematically showing the active boron acceptor concentration depth profile 20 (FIG. 1C) and the copper concentration depth profile 30, with concentrations plotted along the ordinate. FIGS. 1A and 1B show schematically that the driving force for the copper diffusion into wafer 5 is the impurity concentration gradient in the near-surface region, near the surface 10 of wafer 5. Dissociation of the copper-boron pairs 15 is the limiting factor for the copper diffusion. FIG. 1A shows schematically the copper concentration gradient at room temperature, with substantially all of the copper concentrated very close to surface 10 of wafer 5 (depth near zero), with a copper concentration depth profile 30 and with almost all of the copper bound up in immobile copper-boron pairs 15. FIG. 1B shows schematically the effect of annealing at about 100° C., with the copper-boron pairs 15 dissociating and with the dissociated interstitial copper ions ($Cu_i^+$) diffusing into wafer 5, driven by the copper concentration gradient, as shown by the arrows and the changed copper concentration depth profile 30. FIG. 1C shows that copper-boron pair re-association leads to a decrease in the acceptor concentration, such that the active boron acceptor concentration depth profile 20 indicates the penetration of copper. The copper concentration depth profile 30 decreases with increasing depth into wafer 5, while the active boron acceptor concentration depth profile 20 increases with increasing depth into wafer 5. At thermal equilibrium, the bulk interstitial copper concentration $N_{Cu}$ added together with the bulk concentration $N_{Cu-B}$ of copper-boron pairs 15 is equal to the bulk active boron acceptor concentration $N_A$.

Figure 2:
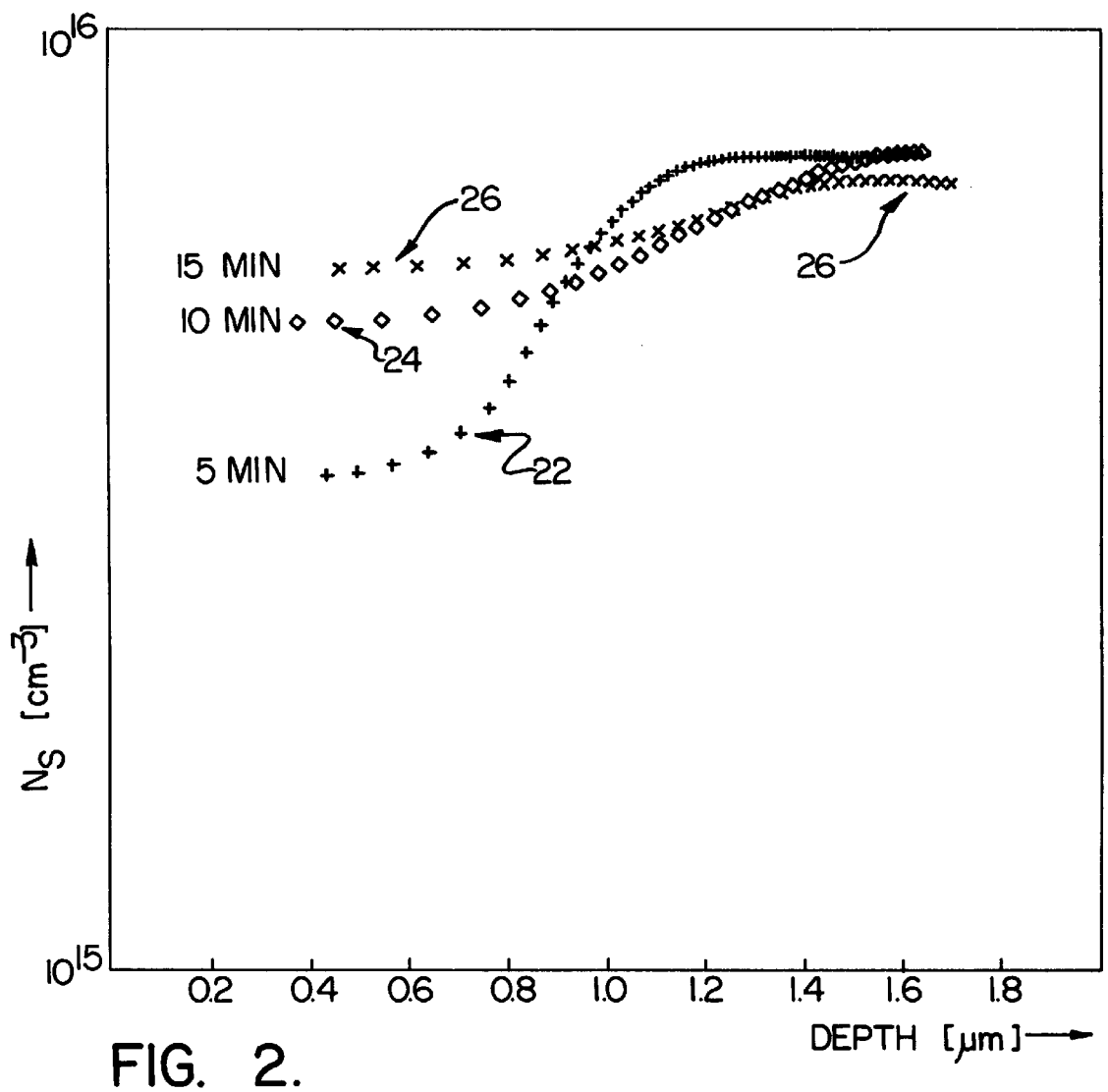
FIG. 2 Changes of the active boron concentration profiles due to copper diffusion into the silicon wafer at 120° C. The silicon wafer was contaminated with copper via HF immersion.

FIG. 2 presents the active boron acceptor depth profiles obtained after diffusion of copper from the p-type silicon wafer surface at 120° C. into the near-surface regions of the p-type silicon wafer. In FIG. 2, depth is plotted in microns along the abscissa and concentration is plotted in atoms/cm³ along the ordinate. The p-type silicon wafer was contaminated with copper by means of immersion of the wafer in a hydrofluoric (HF) acid solution contaminated with copper. The active boron acceptor concentration depth profile 22 was obtained after 5 minutes of copper diffusion and indicates that a substantial amount of the copper was still within about 1.0 micron of the wafer surface. The active boron acceptor concentration depth profile 24 was obtained after 10 minutes of copper diffusion and indicates that a significant amount of the copper had diffused beyond about 1.0 micron from the wafer surface. The active boron acceptor concentration depth profile 26 was obtained after 15 minutes of copper diffusion and indicates that a substantial amount of the copper had diffused beyond about 1.6 microns from the wafer surface. Investigation of the time/temperature dependence, as well as the pair dissociation/re-association kinetics, has yielded the determination of the diffusion parameters for the species responsible for boron passivation. The migration enthalpy of 0.45 eV was found to be in good agreement with the diffusivity of copper. The total copper concentration, which is incorporated during the thermal annealing, may be evaluated by integrating the loss of the active boron concentration over the penetration depth by using the simple relation:

$$N_{Cu} = N_A - N_{Cu-B} \tag{2}$$

where $N_{Cu}$ is the bulk copper concentration, NA is the bulk acceptor concentration and $N_{Cu-B}$ is the bulk concentration of copper-boron pairs.

However, it is uncertain whether or not the copper surface source was completely exhausted during the annealing. In addition, the accuracy of integration over a few microns depth is rather poor. To improve the measurements, embodiments of the present invention introduce copper into the wafer by using the effect of the drift of interstitial copper ions ($Cu_i^+$) in an electric field.

(2) Drift of $Cu_i^+$ in an Electric Field

Figure 3A:
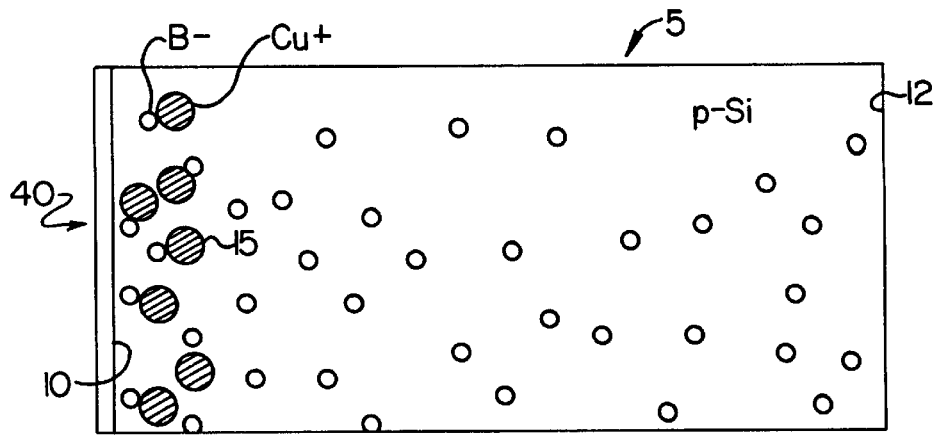
FIGS. 3A–C Schematic presentation of an aspect of embodiments of the present invention. Copper ions ($Cu^+$) are released in the near-surface region and driven by an electric field toward the edge of the space charge region. Copper-boron (Cu—B) pairs may be easily detected by capacitance-voltage measurements.
Figure 3B:
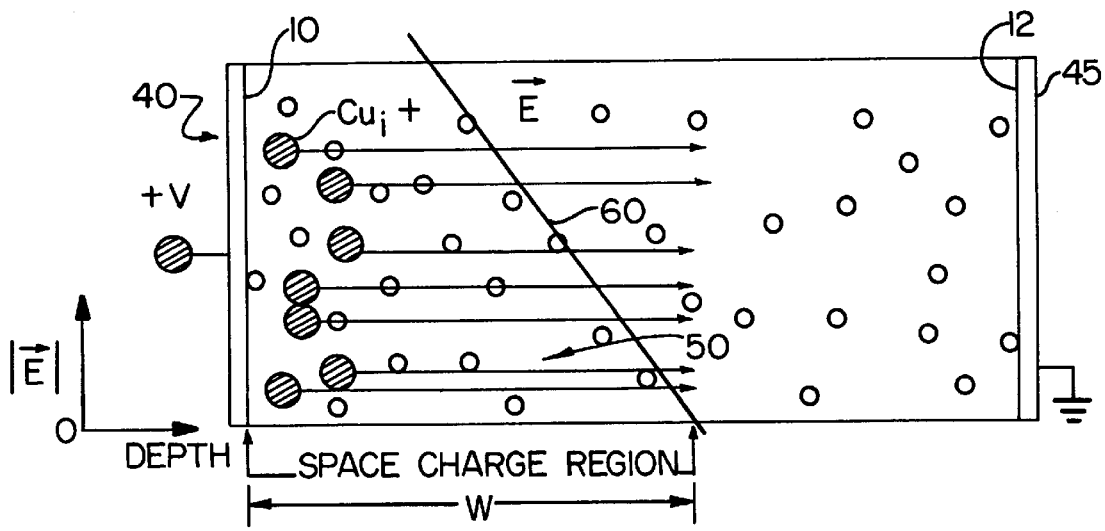
Figure 3C:
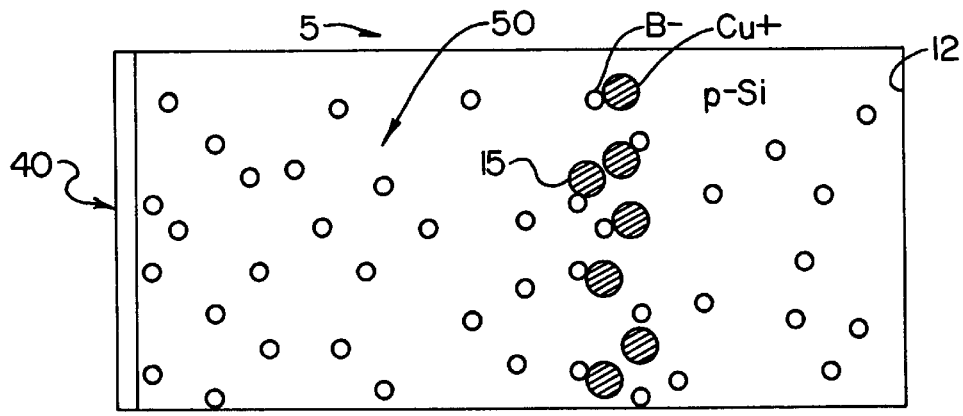

FIGS. 3A–3C show schematic cross-sectional views of p-type silicon wafer 5, with the depth from the surface 10 of the wafer 5 increasing from left to right along the abscissa, while simultaneously schematically showing the magnitude 60 of a reverse-bias electric field (FIG. 3B) which vanishes at the edge of a space charge region 50 at a depth W within wafer 5, with the electric field magnitude plotted along the ordinate. FIGS. 3A–3C show that by applying a reverse bias to Schottky diode 40, with a grounded ohmic contact 45 formed on the back side 12 of wafer 5, embodiments of the present invention create the driving force for the drift of interstitial copper ions ($Cu_i^+$) along an electric field, which has magnitude 60 and which is directed from surface 10 of wafer 5 toward the edge of space charge region 50 at depth W from surface 10 of wafer 5. FIG. 3A shows schematically the copper concentration gradient at room temperature, with substantially all of the copper concentrated very close to surface 10 of wafer 5 (depth near zero) and with almost all of the copper bound up in immobile copper-boron pairs 15. FIG. 3B shows schematically the effect of annealing at about 100° C. in the presence of the electric field with magnitude 60 directed from surface 10 of wafer 5 toward the edge of space charge region 50 at depth W from surface 10 of wafer 5, with the copper-boron pairs 15 dissociating and with the dissociated interstitial copper ions ($Cu_i^+$) drifting toward the edge of space charge region 50 at depth W from surface 10 of wafer 5, driven into wafer 5 along the electric field, as shown by the arrows. FIG. 3C shows schematically the effect of continuing the annealing at about 100° C. in the presence of the electric field with magnitude 60 directed from surface 10 of wafer 5 toward the edge of space charge region 50 at depth W from surface 10 of wafer 5, with the dissociated interstitial copper ions ($Cu_i^+$) accumulating at the edge of space charge region 50 at depth W from surface 10 of wafer 5, and re-associating with the active boron acceptors present there to form copper-boron pairs 15, which are then subject to thermal diffusion again due to the new concentration gradient of copper-boron pairs at depth W. Provided the annealing temperature is high enough for copper-boron pair 15 dissociation, the released interstitial copper ions ($Cu_i^+$) are driven by the reverse biasing toward the edge of space charge region 50 at depth W from surface 10 of wafer 5, and then re-associate into neutral copper-boron pairs 15. The local accumulation of copper at the edge of space charge region 50 leads to a drastic decrease in the active boron concentration at depth W from surface 10 of wafer 5.

Figure 4:
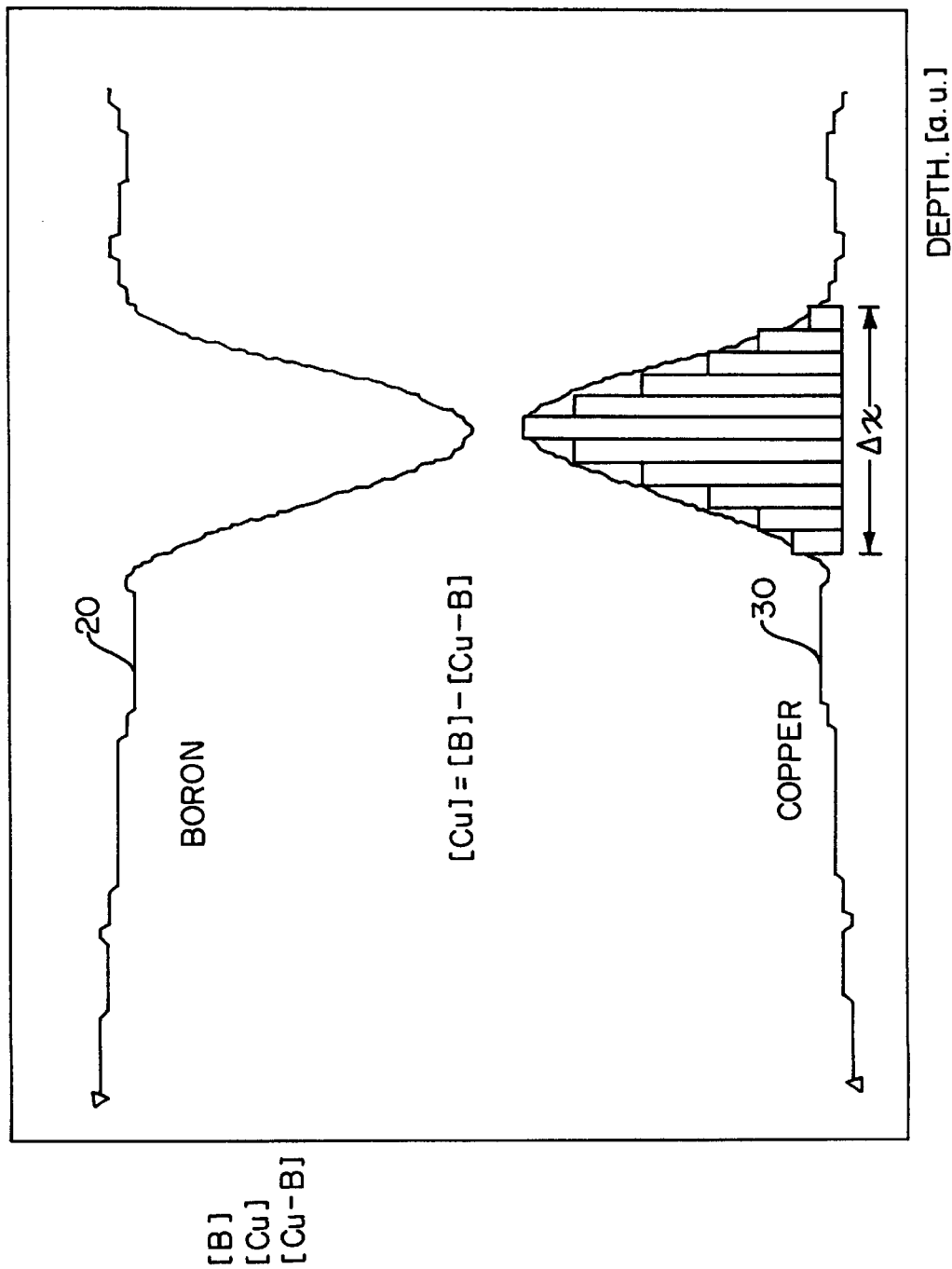
FIG. 4 Schematic presentation of the local boron passivation due to copper-boron pair formation at the edge of the space charge region. By integrating the boron concentration over the thickness of a valley in the boron concentration one obtains the copper concentration.

FIG. 4 shows schematically that as a result of copper-boron pair 15 formation, a valley in the active boron shallow acceptor concentration depth profile 20 is observed, corresponding to a peak in the copper concentration depth profile 30. The depth is plotted in arbitrary units along the abscissa and the concentrations are plotted along the ordinate. To determine the copper concentration, the loss in the active boron acceptor concentration needs to be integrated over a layer of a certain thickness Δx shown in FIG. 4. The depth W, at the edge of space charge region 50 as shown in FIG. 3C, at which the valley can be observed after bias annealing, is a function $W(V_R, N_A(x))$ of a reverse bias voltage $V_R$, and the shallow acceptor depth distribution $N_A(x)$:

$$W(V_R, N_A(x)) = (2\epsilon_s V_R/[qN_A(x)])^{1/2} \quad [3]$$

where W is the depth of the edge of the space charge region 50;

$V_R$ is the reverse bias voltage;

q is the elementary charge (e.g., of an electron);

$\epsilon_s$ is the permittivity of silicon; and $N_A(x)$ is the concentration of electrically active boron at a depth x below surface 10 of p-type silicon wafer 5.

Figure 5A:
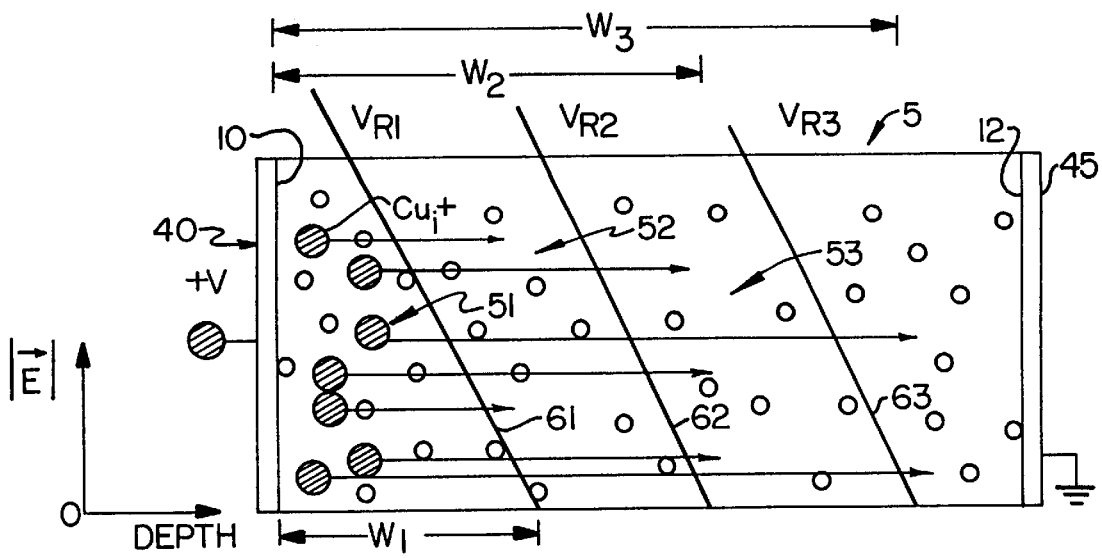
FIGS. 5A–C Schematic presentation of the possibility of controlling a depth position of the peaked copper concentration driven from the surface during bias annealing.
Figure 5B:
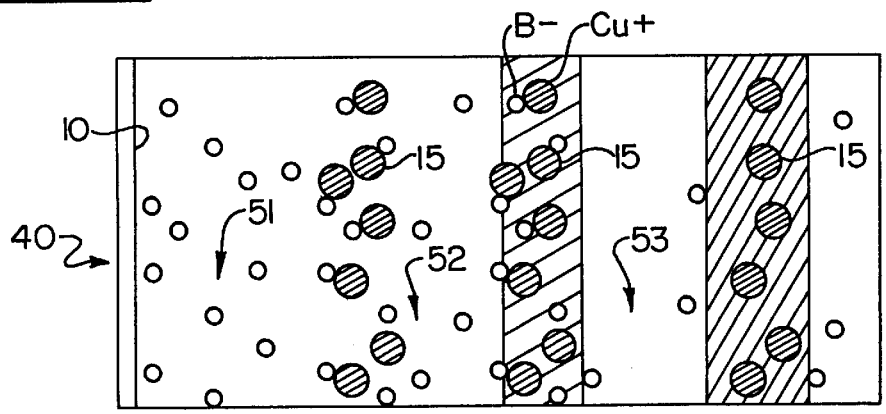
Figure 5C:
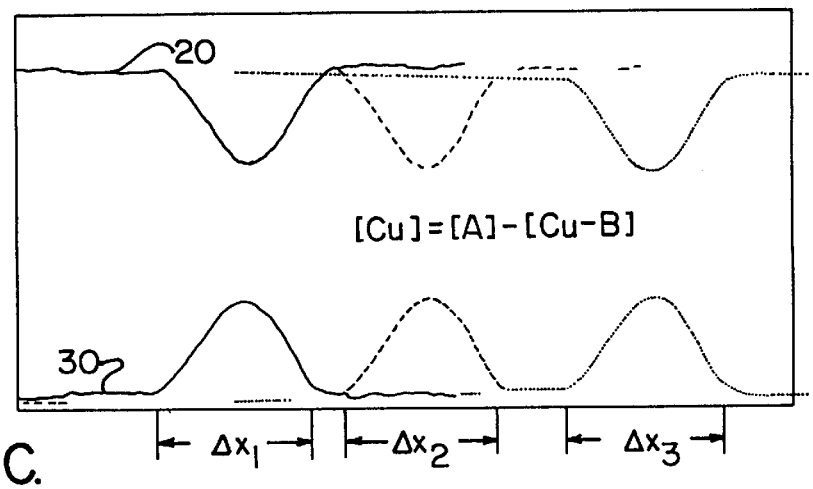

FIGS. 5A–5C schematically demonstrate the possibility of controlling the penetration depth of copper driven from surface 10 of p-type silicon wafer 5 during bias annealing by varying the magnitude of the reverse bias voltage $V_R$. FIGS. 5A and 5B show schematic cross-sectional views of p-type silicon wafer 5, with the depth from the surface 10 of the p-type silicon wafer 5 increasing from left to right along the abscissa, while simultaneously schematically showing the magnitudes 61–63 of reverse-bias electric fields (FIG. 5A) which vanish at the edges of space charge regions 51–53 at depths $W_1$–$W_3$ within wafer 5, respectively, with the electric field magnitude plotted along the ordinate. FIGS. 5A and 5B show that by applying reverse biases to Schottky diode 40, with grounded ohmic contact 45 formed on back side 12 of wafer 5, embodiments of the present invention create the driving forces for the drift of interstitial copper ions ($Cu_i^+$) along electric fields, which have magnitudes 61–63 and which are directed from surface 10 of wafer 5 toward the edges of space charge regions 51–53 at depths $W_1$–$W_3$, respectively, from surface 10 of wafer 5. FIG. 5A shows schematically the effect of annealing in the presence of the electric fields with magnitudes 61–63 directed from surface 10 of wafer 5 toward the edges of space charge regions 51–53 at depths $W_1$–$W_3$, respectively, from surface 10 of wafer 5, with the copper-boron pairs 15 dissociating and with the dissociated interstitial copper ions ($Cu_i^+$) drifting toward the edges of space charge regions 51–53 at depths $W_1$–$W_3$, respectively, from surface 10 of wafer 5, driven into wafer 5 along the electric fields, as shown by the arrows. FIG. 5B shows schematically the effect of continuing the annealing at about 100° C. in the presence of the electric fields with magnitudes 61–63 directed from surface 10 of wafer 5 toward the edges of space charge regions 51–53 at depths $W_1$–$W_3$, respectively, from surface 10 of wafer 5, with the dissociated interstitial copper ions ($Cu_i^+$) accumulating at the edges of space charge regions 51–53 at depths $W_1$–$W_3$, respectively, from surface 10 of wafer 5, and re-associating with the active boron acceptors present there to form copper-boron pairs 15, which are then subject to thermal diffusion again due to the new concentration gradient of copper-boron pairs at depths $W_1$–$W_3$. The local accumulation of copper at the edges of space charge regions 51–53 leads to a drastic decrease in the active boron concentration at depths $W_1$–$W_3$, respectively, from surface 10 of wafer 5.

FIG. 5C shows schematically that as a result of copper-boron 15 pair formation, valleys in the active boron shallow acceptor concentration depth profiles 20 are observed, corresponding to peaks in the copper concentration depth profiles 30. The depth is plotted in arbitrary units along the abscissa and the concentrations are plotted along the ordinate. To determine the copper concentration, the loss in the active boron acceptor concentration needs to be integrated over layers of certain thicknesses $\Delta X_1$–$\Delta X_3$ shown in FIG. 5C. The depths $W_1$–$W_3$, at the edges of space charge regions 51–53, respectively, as shown in FIG. 5A, at which the valleys can be observed after bias annealing, are functions $W_i(V_{Ri}, N_A(x))$ of reverse bias voltages $V_{Ri}$, and the shallow acceptor depth distribution $N_A(x)$:

$$W_i(V_{Ri}, N_A(x)) = (2\epsilon_s V_{Ri}/[qN_A(x)])^{1/2} \quad [3]$$

where $W_1$ is the depth of the edge of the space charge region 51;

$W_2$ is the depth of the edge of the space charge region 52;

$W_3$ is the depth of the edge of the space charge region 53;

$V_{Ri}$ are reverse bias voltages, with $V_{R1} < V_{R2} < V_{R3}$;

q is the elementary charge (e.g., of an electron);

$\epsilon_s$ is the permittivity of silicon; and $N_A(x)$ is the concentration of electrically active boron at a depth x below surface 10 of p-type silicon wafer 5.

FIG. 6 shows the dependence of the position of the valley in the active boron concentration depth profiles 21, 23 and 25 on the magnitudes of the reverse biases during annealing at 110° C. for five minutes. In FIG. 6, depth is plotted in microns along the abscissa and concentration is plotted in atoms/cm³ along the ordinate. The active boron concentration depth profile 21 was obtained without any reverse bias and indicates that a substantial amount of the copper was still within about 2.0 microns of the p-type silicon wafer surface. The active boron concentration depth profile 23 was obtained with a reverse bias of 2 V and indicates that a significant amount of the copper still remained within about 2.0 microns of the p-type silicon wafer surface. The active boron concentration depth profile 25 was obtained with a reverse bias of 5 V and indicates that a substantial amount of the copper had been driven by the bias annealing to about 4.5 microns from the p-type silicon wafer surface. It can be seen from this data that the reverse bias should be high enough to drive substantially all of the copper from the surface ($N_A$ in the near-surface region is equal to that in the bulk), and to form a nicely shaped valley.

Figure 7A:
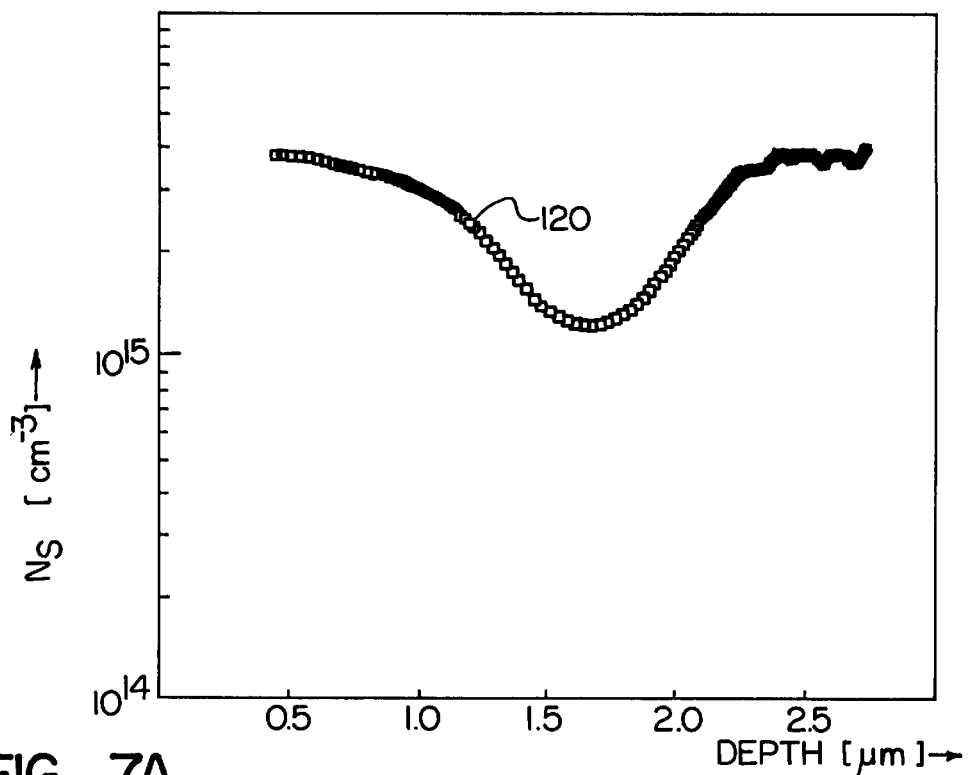
FIGS. 7A–B Experimentally observed depth profiles of shallow acceptors after bias annealing at 110° C. for 10 min (top) and 40 min (bottom). Long annealing led to significant redistribution of copper via thermal diffusion.
Figure 7B:
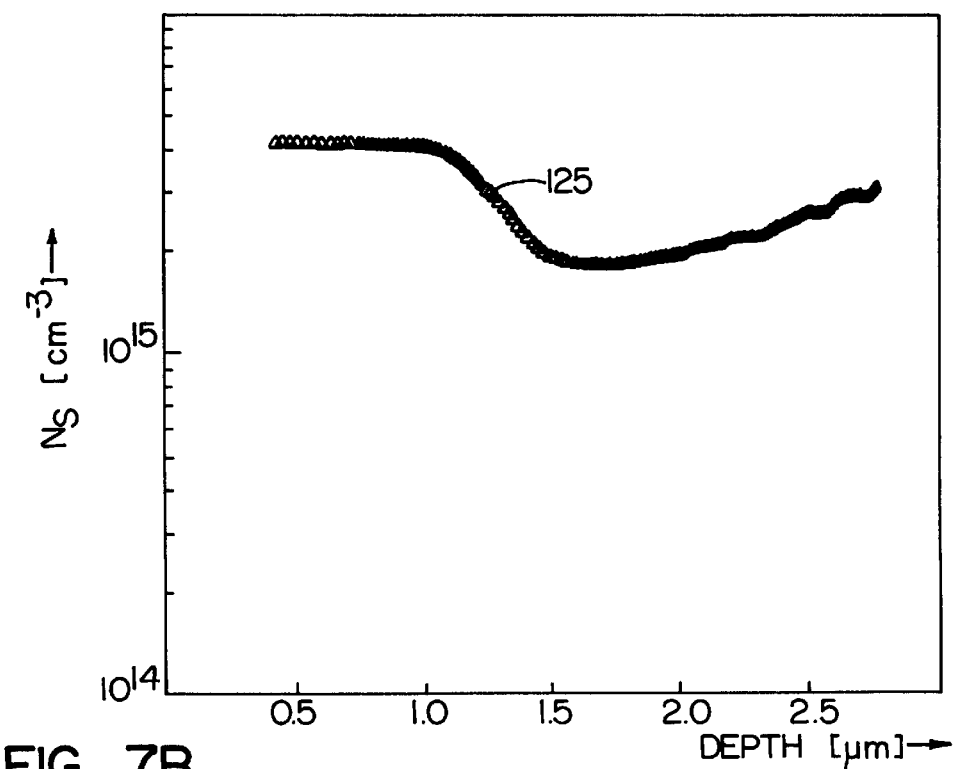

FIGS. 7A and 7B show the effect of a long bias annealing time, which results in significant redistribution of copper beyond the space charge region in a p-type silicon wafer. In FIGS. 7A and 7B, depth is plotted in microns along the abscissas and concentration is plotted in atoms/cm³ along the ordinates. FIG. 7A shows an experimentally observed concentration depth profile 120 of shallow acceptors after bias annealing at 110° C. for 10 minutes with a reverse bias of 5 V and a well-defined minimum in the valley of concentration depth profile 120 between about 1.5 microns and 2.0 microns. FIG. 7B shows an experimentally observed concentration depth profile 125 of shallow acceptors after bias annealing at 110° C. for 40 minutes with a reverse bias of 5 V and shows that long annealing can lead to significant redistribution of copper beyond the space charge region and beyond about 2.0 microns due to thermal diffusion. By varying both the annealing time and temperature, as well as the magnitude of the reverse bias, appropriate annealing conditions may be obtained, which should satisfy the following requirements:

(a) the surface source for copper should be completely exhausted during bias annealing;
(b) the temperature should be high enough to dissociate copper-boron pairs; and
(c) the thermal budget should be low enough to suppress the thermal diffusion of copper beyond the space charge region.

In order to meet these requirements, the kinetics for both copper-boron pair dissociation and re-association have been investigated.

(3) Copper-Boron Dissociation/Association Rates

The copper-boron pair dissociation rate was directly measured via the changes in the acceptor concentration as a function of the bias annealing time. Two bias annealing stages were utilized. The first stage included isothermal bias annealing under a reverse bias of $V_R$=2 V. The in situ capacitance-voltage measurements were carried out at the annealing temperature in order to increase the experimental accuracy. By the time a valley in the acceptor concentration was formed, the reverse bias was increased to $V_R$=18 V.

Figure 8:
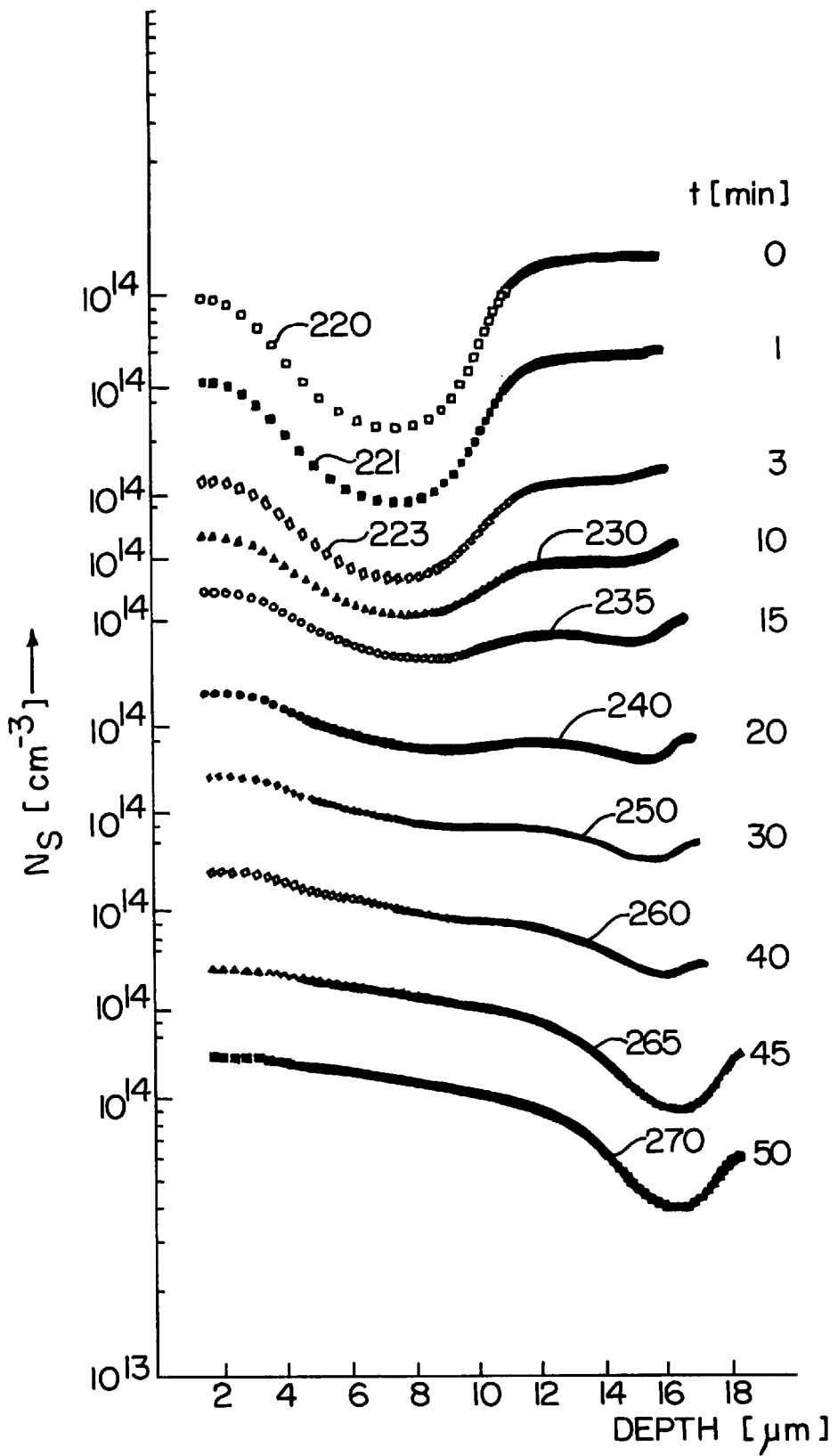
FIG. 8 In situ time-dependent monitoring of copper drift during isothermal bias annealing at 90° C. under 18 V. Initial valley in the shallow acceptor depth profile was formed under 2 V at 90° C. for 60 min.

FIG. 8 shows the time-dependent changes of the acceptor concentration depth profiles in a p-type silicon wafer after such an increase of the reverse bias at 90° C. In FIG. 8, depth is plotted in microns along the abscissa and concentration is plotted in atoms/cm$^3$ along the (multiple, superimposed) ordinates. The initial valley in the acceptor concentration depth profile 220 was formed under bias annealing at 90° C. for 60 minutes with a reverse bias of 2 V with a minimum in acceptor concentration depth profile 220 at about 8 microns. Acceptor concentration depth profile 221 was formed under bias annealing at 90° for 1 minute after the reverse bias had been increased to 18 V, acceptor concentration depth profile 223 was formed under bias annealing at 90° for 3 minutes after the reverse bias had been increased to 18 V, acceptor concentration depth profile 230 was formed under bias annealing at 90° for 10 minutes after the reverse bias had been increased to 18 V, acceptor concentration depth profile 235 was formed under bias annealing at 90° for 15 minutes after the reverse bias had been increased to 18 V, acceptor concentration depth profile 240 was formed under bias annealing at 90° for 20 minutes after the reverse bias had been increased to 18 V, acceptor concentration depth profile 250 was formed under bias annealing at 90° for 30 minutes after the reverse bias had been increased to 18 V, acceptor concentration depth profile 260 was formed under bias annealing at 90° for 40 minutes after the reverse bias had been increased to 18 V, acceptor concentration depth profile 265 was formed under bias annealing at 90° for 45 minutes after the reverse bias had been increased to 18 V, and acceptor concentration depth profile 270 was formed under bias annealing at 90° for 50 minutes after the reverse bias had been increased to 18 V, by which time the minimum in acceptor concentration depth profile 270 had shifted to about 16 microns. The data clearly exhibit the motion of the copper along the electric field. It is also clearly seen that pair dissociation is a limiting stage for the interstitial copper ion ($Cu_i^+$) drift under bias annealing.

The copper-boron pair association was measured via annealing experiments by applying a variable bias to the Schottky diode. In this case, the DC reverse bias was superimposed with pulses of opposite polarity, such that the reverse bias $V_R$ was reduced to 0 when the pulse was on. By varying the ratio $t_p/T_p$ with $T_p$ held constant, where $t_p$ and $T_p$ are the pulse width and the pulse period, respectively, the pair re-association rate was estimated.

Figure 9:
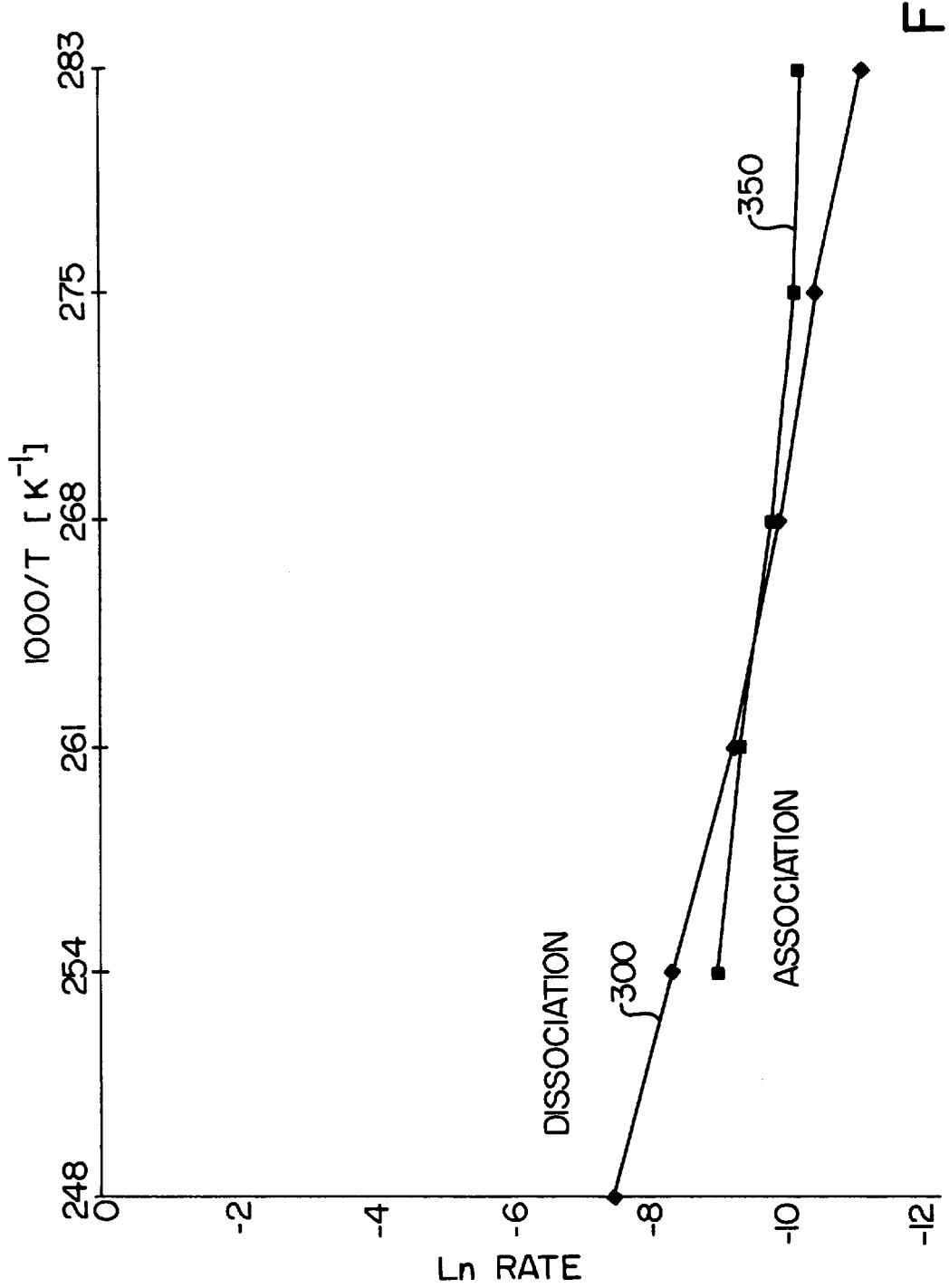
FIG. 9 Copper-boron pair dissociation and association rates as a function of temperature.

FIG. 9 shows that both the copper-boron pair dissociation rate 300 and the copper-boron re-association rate 350 revealed an Arrhenius-like temperature dependence. In FIG. 9, temperature is plotted in inverse degrees Kelvin ($K^{-1}$) along the abscissa and the natural logarithm of the rate is plotted along the ordinate. An important conclusion from these data is that the most appropriate annealing temperature for copper incorporation is T about $T_c$, where $T_c$ is the cross-over temperature where copper-boron pair dissociation rate 300 and copper-boron re-association rate 350 are equal. Indeed, for $T<<T_c$, copper-boron pair association is the dominant process and copper cannot be released and driven into the silicon bulk. For $T>>T_c$, the drift of interstitial copper ions ($Cu_i^+$) toward the edge of the space charge region will be followed by fast diffusion of copper deeper into the silicon neutral region.

3. Experimental Verification of Embodiments of the Present Invention Method

Additional experimental data related to aspects of embodiments of the present invention method were obtained on silicon wafers deliberately contaminated with copper near room temperature using immersion into contaminated hydrofluoric acid (HF), or contaminated by various wafer processing steps.

(1) Monitoring of Copper Contamination on Epitaxial Silicon Wafer Surfaces Due to Immersion into HF: Capacitance-Voltage Total Reflection X-Ray Fluorescence Correlations After deposition of epitaxial layer, the wafers were immersed into Cu contaminated HF. The Cu contamination level at the wafer surface was monitored by total reflection x-ray fluorescence analysis (TXRF), note Table 1. Schottky diodes were fabricated by deposition of samarium (Sm) onto the epi-layer. The wafers then received the bias annealing treatment to drive Cu into near surface region and were measured by the C-V technique.

Table 1 summarizes the quantitative data obtained on silicon wafers immersed into uncontaminated and contaminated HF.

TABLE 1

Copper Surface Concentration Measured by Total Reflection X-Ray Fluorescence on Silicon Wafers Immersed in HF

| Samples Immersed into HF | Cu Surface Concentration ($10^{10}$ cm$^{-2}$) |
|---|---|
| uncontaminated HF | <1 |
|  | 2 |
| lightly contaminated HF | 20 |
|  | 3 |
| heavily contaminated HF | 40 |
|  | 30 |

Figure 10:
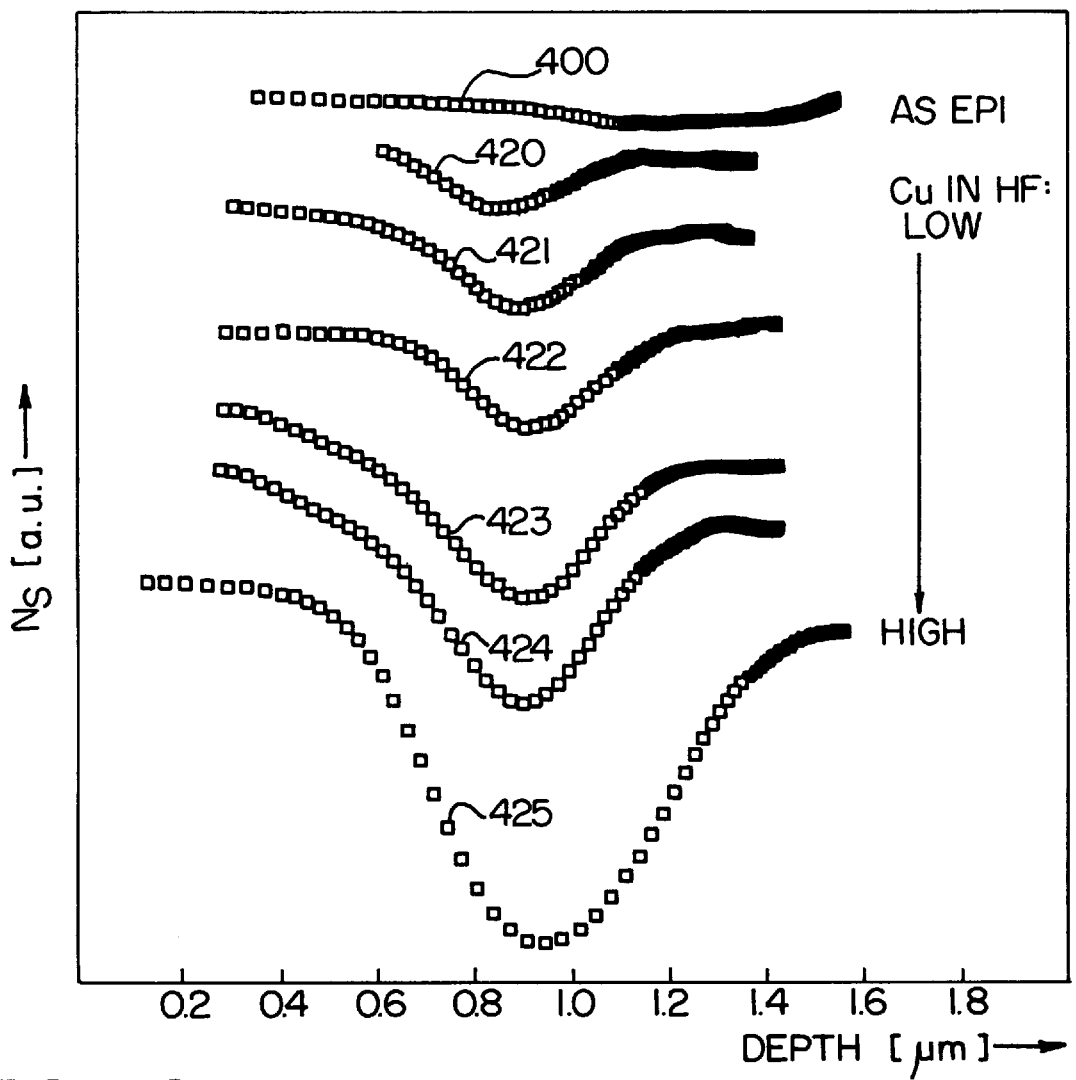
FIG. 10 Shallow acceptor depth profiles on silicon wafers immersed into Cu contaminated HF.

FIG. 10 shows the changes in shallow acceptor concentration depth profiles 420–425 due to copper-induced boron passivation obtained by embodiments of the present invention method, with copper driven from a p-type silicon wafer surface at 100° C. In FIG. 10, depth is plotted in microns along the abscissa and concentration is plotted in arbitrary units along the ordinate. Shallow acceptor depth profile 400 was obtained on uncontaminated as-epi p-type silicon wafer. This wafer revealed flat shallow acceptor depth profile over the depth of 1.5 microns. Shallow acceptor concentration depth profile 420 was obtained with a p-type silicon wafer immersed in the lightly Cu contaminated HF and shows the shallowest valley, with a minimum at about 0.8 micron. Shallow acceptor concentration depth profiles 421–424 are intermediate between shallow acceptor concentration depth profiles 420 and 425. Shallow acceptor concentration depth profile 425 was obtained with a p-type silicon wafer immersed in the heavily Cu contaminated HF and shows the deepest valley, with a minimum shifted to about 1.0 micron. Thus, an increase in the surface Cu concentration resulted in a decrease in the electrically active boron concentration.

Figure 11:
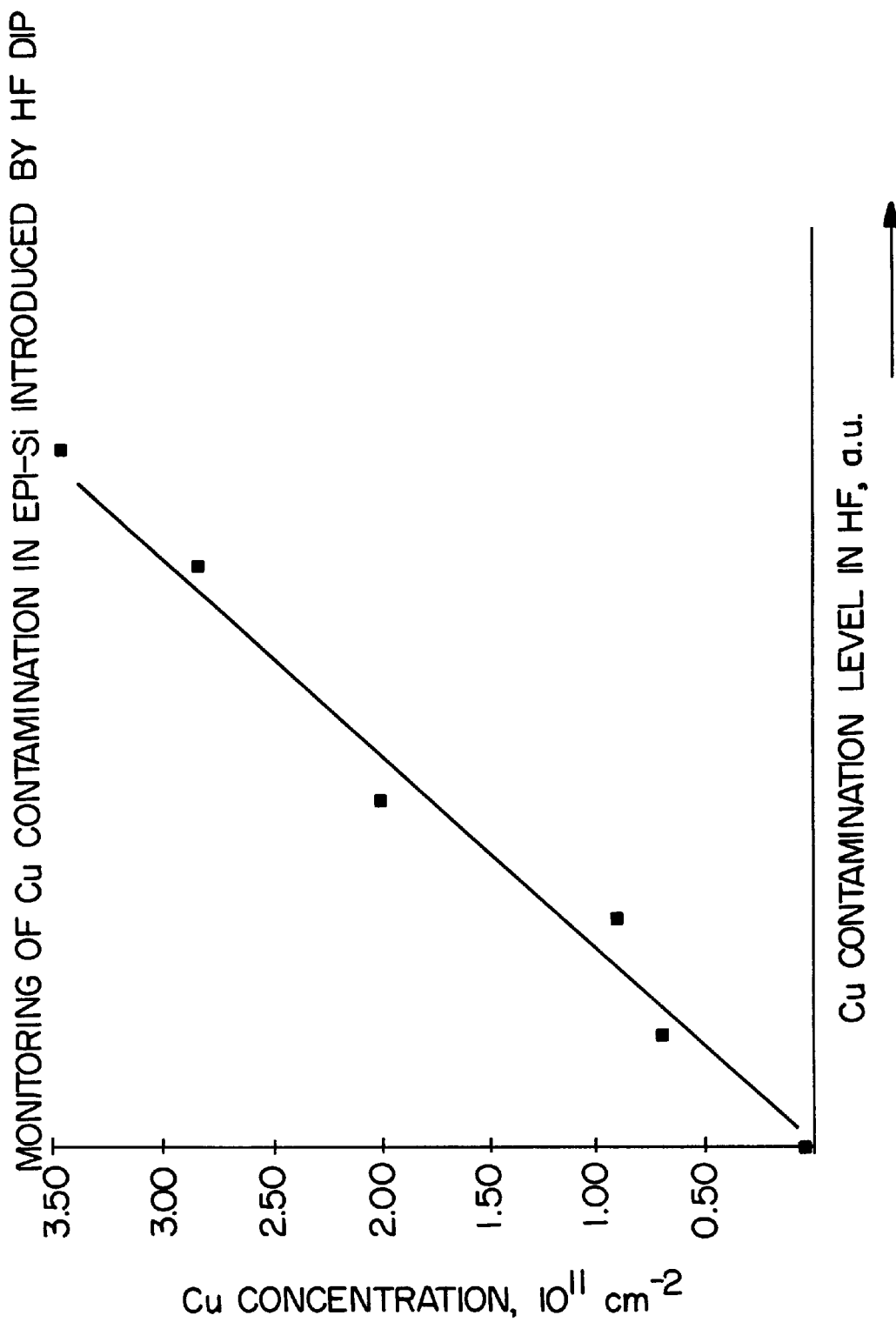
FIG. 11 Data from FIG. 10 recalculated in terms of the copper surface concentration.

FIG. 11 shows the data from FIG. 10 recalculated in terms of copper surface concentrations by integrating the loss in the shallow acceptor concentration over the depth of the valley, and shows the monitoring of copper contamination in epitaxial p-type silicon wafers by using an HF dip, with the copper driven from the wafer surface at 100° C.

(2) Capacitance-Voltage-Inductively Coupled Plasma Mass Spectroscopy Correlations Wafer processing includes a variety of chemical and thermal treatments. Three sets of wafers (five wafers in each set) were taken for surface analysis after three different technological steps:

(a) Sample A: wafer heat treatment at 680° C.;

(b) Sample B: modified RCA-1 procedure; and (c) Sample C: modified RCA-2 procedure.

RCA-1 and RCA-2 are well known methods for silicon wafer cleaning and are well described in literature such as W. Kern and D. A. Puotinen, *Cleaning Solutions based on Hydrogen Peroxide for Use in Silicon Semiconductor Technology*, RCA Rev. 31, 187 (1970).

Table 2 summarizes the results of inductively coupled plasma mass spectroscopy analyses of these wafers, while Table 3 presents the data obtained by an embodiment of the present invention method.

TABLE 2

Summary of Inductively Coupled Plasma Mass Spectroscopy ICP/MS Analyses of Si Wafers Subjected to Various Wafer Treatments.

| Wafer Processing | Sample Spec | [Cu63], $10^{10}cm^{-2}$ |
|---|---|---|
| Wafer heat treatment | A1 | 0 |
|  | A2 | 0 |
|  | A3 | 0 |
|  | A4 | 0 |
|  | A5 | 0 |
| Modified RCA-1 | B1 | 3.8 |
|  | B2 | 5.9 |
|  | B3 | 4.4 |
|  | B4 | 8.0 |
|  | B5 | 0 |
| Modified RCA-2 | C1 | 3.0 |
|  | C2 | 1.8 |
|  | C3 | 4.6 |
|  | C4 | 2.8 |
|  | C5 | 7.4 |

TABLE 3

Copper Contamination Level As Detected by an Embodiment of the Present Invention Method on Three Si Wafers After Various Wafer Processing Steps

| Wafer A | $<5 \times 10^9 cm^{-3}$ |
|---|---|
| Wafer B | $4 \times 10^{10} cm^{-3}$ |
| Wafer C | $13 \times 10^{10} cm^{-3}$ |

The reference p-type silicon wafer (as received, before processing) revealed a surface concentration of copper of less than about $5 \times 10^9 cm^{-2}$. The data obtained by the both methods on the processed wafers A to C are in good agreement, as can be seen from data in Table 2 and Table 3.

(3) Detection of Ultra-Low Surface Copper Contamination

Figure 12A:
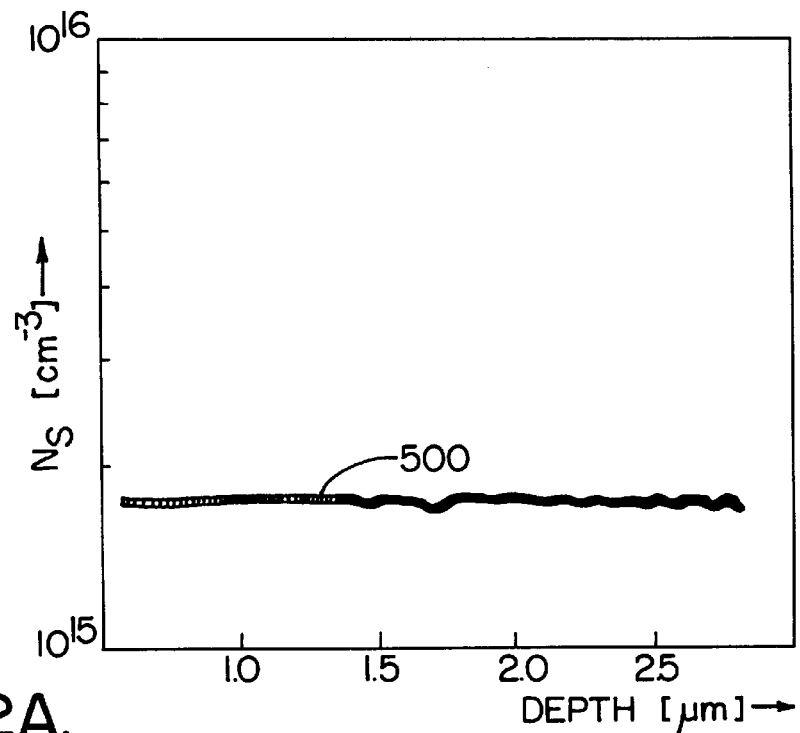
FIGS. 12A–B Shallow acceptor depth profiles before (top) and after (bottom) bias annealing. The surface copper concentration is estimated to be about $10^{10} cm^{-2}$. The sensitivity limit of this method is $\sim 5 \times 10^9 cm^{-2}$.
Figure 12B:
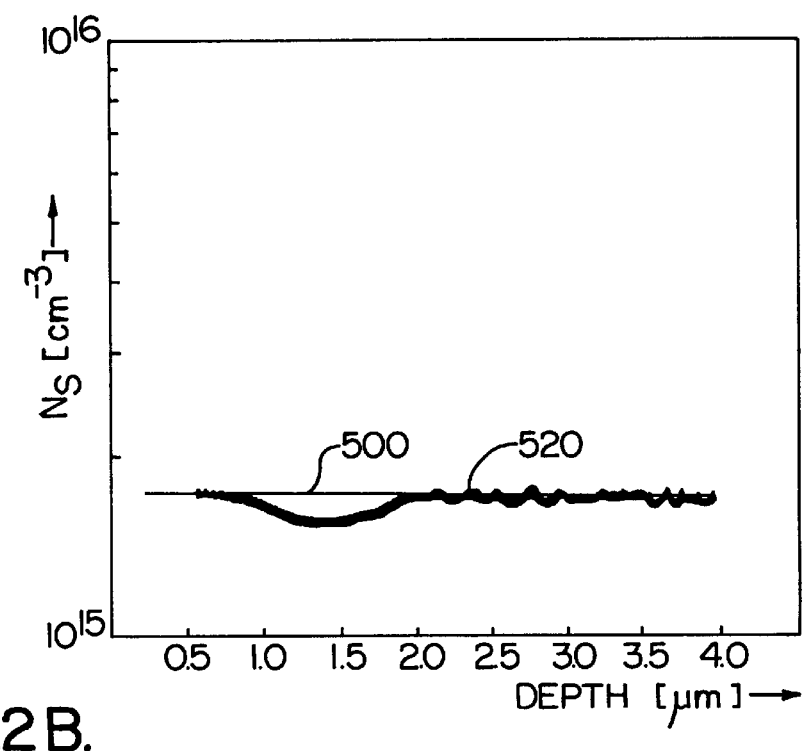

FIGS. 12A and 12B demonstrate capacitance-voltage doping profile experimental data obtained on a p-type silicon wafer with ultra-low surface copper contamination from HF dipping and subsequent bias annealing. In FIGS. 12A and 12B, depth is plotted in microns along the abscissas and concentration is plotted in atoms/cm³ along the ordinates. FIG. 12A shows the shallow acceptor concentration depth profile 500 before bias annealing. FIG. 12B shows the shallow acceptor concentration depth profile 520 after bias annealing with a reverse bias of 2 V, revealing a minimum in shallow acceptor concentration depth profile 520 at about 1.5 microns. The presence of copper (at or below the total reflection x-ray fluorescence sensitivity limit, i.e., surface concentrations of $\leq 10^{10}$ cm$^{-2}$) was detected after the impurity was driven into the bulk of the wafer by bias annealing. The sensitivity limit for the Cu surface concentration determined by the novel method is approximately $10^9$ Cu/cm². This concentration was estimated utilizing FIG. 12B and corresponding DLTS bulk concentration of $10^{13}$ cm$^{-3}$, note FIG. 14B.

(4) Comparison of the Properties of Copper-Related Defects in Silicon Wafers Contaminated with Copper at High and Low Temperatures In order to confirm additionally that copper contamination is involved rather than contamination with iron or hydrogen, which are also known to passivate boron, detailed deep level transient spectroscopy analyses on silicon wafers contaminated with copper have been carried out by various methods. The silicon wafers contaminated with copper near room temperature were compared with the wafers contaminated with copper at high temperature using spin coating or copper ion (Cu+) implantation followed by rapid thermal annealing at 950° C. for 5 min. The properties of copper introduced into p-ype silicon at high temperatures have already been thoroughly investigated and described in the scientific publications. As will be shown below, the properties of Cu-related electronic defects introduced at high temperature coincide with the properties of copper introduced near room temperature.

Figure 13A:
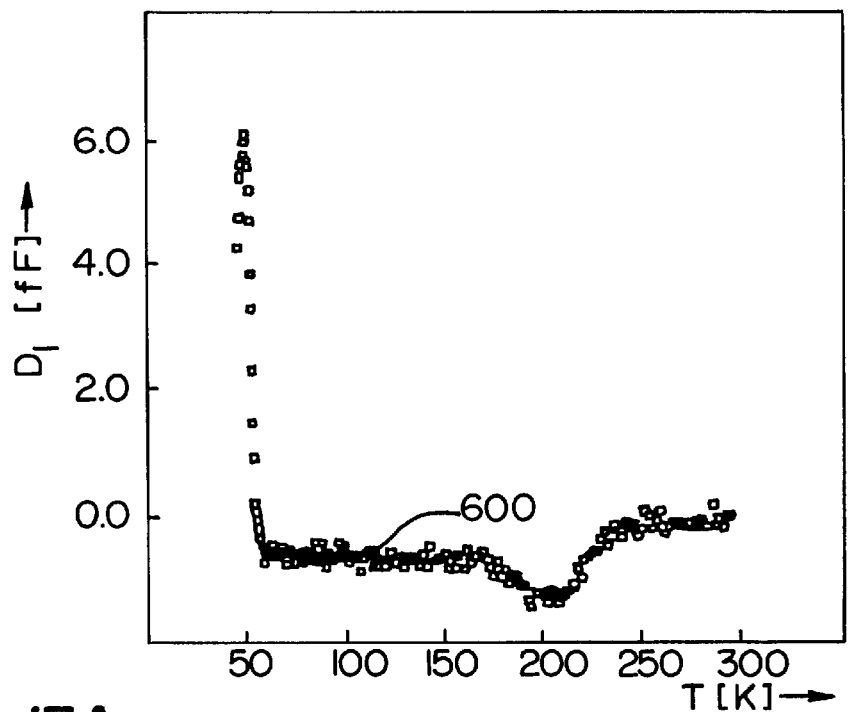
FIGS. 13A–B Deep level transient spectroscopy spectra obtained on p-type silicon contaminated with copper near room temperature: annealing at 120° C. (top) followed by annealing at 200° C., slow cooling (bottom).
Figure 13B:
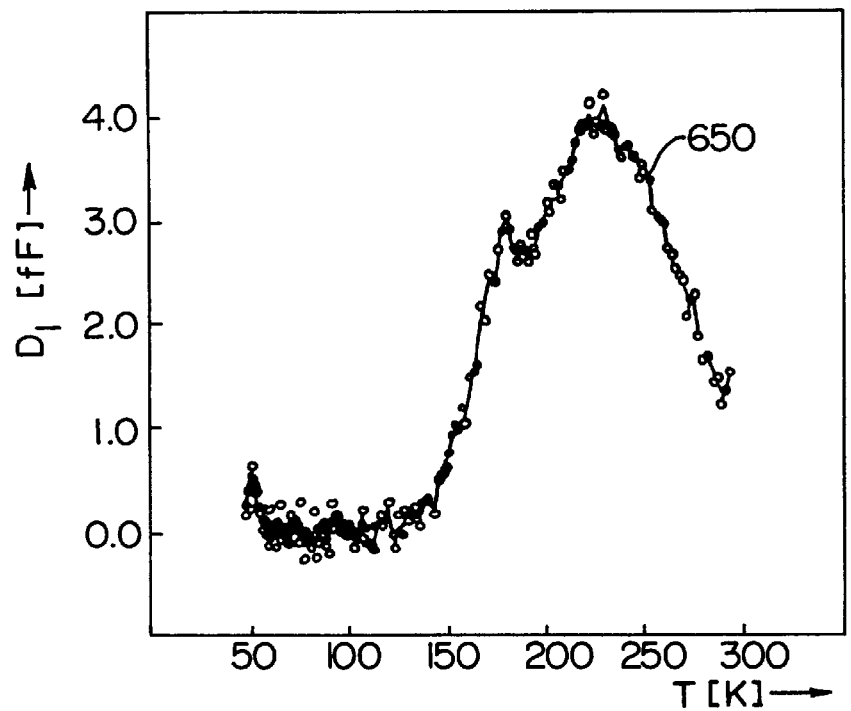

FIG. 13A shows a deep level transient spectroscopy spectrum 600 obtained on p-type silicon wafers contaminated with copper near room temperature, with annealing at 120° C. FIG. 13B shows a deep level transient spectroscopy spectrum 650 obtained on p-type silicon wafers contaminated with copper near room temperature, with annealing at 200° C. followed by slow cooling. The temperature is plotted in degrees Kelvin (K) along the abscissa and the differential capacitances are plotted in femtofarads (1 fF=$10^{-15}$ F) along the ordinate. FIGS. 13A and 13B show that in p-type silicon wafers contaminated near room temperature, copper-boron pair formation is accompanied by appearance of the deep level trap at $E_v$+0.095 eV. This trap is commonly attributed to copper—copper pairs. Further confirmation of the presence of copper was obtained by determination of the thermal stability of this trap at $E_v$+0.095 eV. Similar to existing data, it was found that this trap is not stable at T>150° C. The major properties of this trap, such as the activation energy, capture cross-section, trap occupation kinetics and thermal stability, were found to be similar to the properties of copper—copper defects observed in silicon wafers contaminated at high temperature.

Figure 14A:
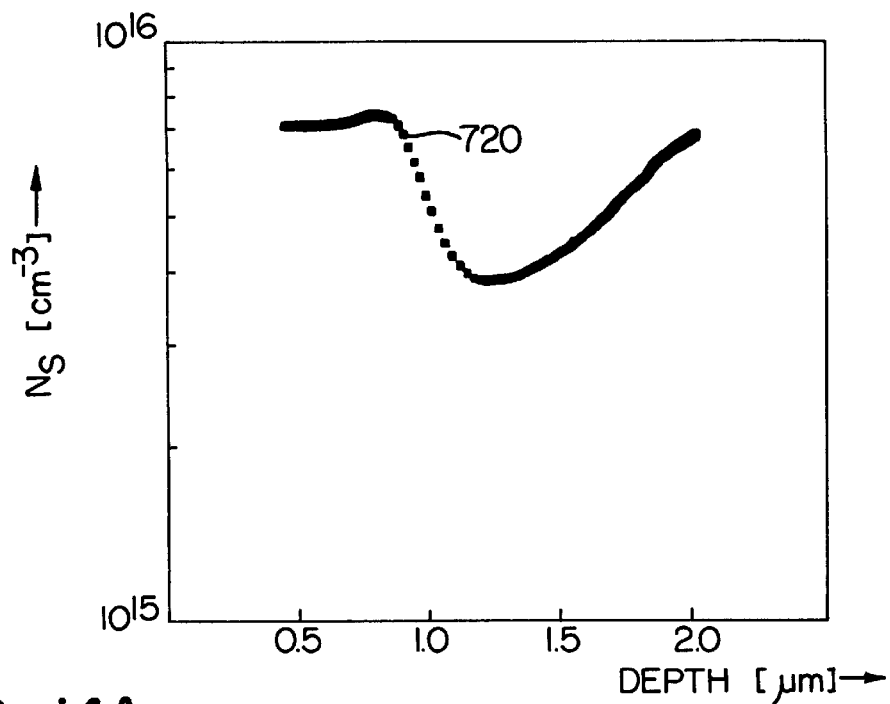
FIGS. 14A–B Depth profiles of shallow acceptors (top) and Cu—Cu traps (bottom) in p-type silicon wafer after bias annealing at 120° C. for 10 min.
Figure 14B:
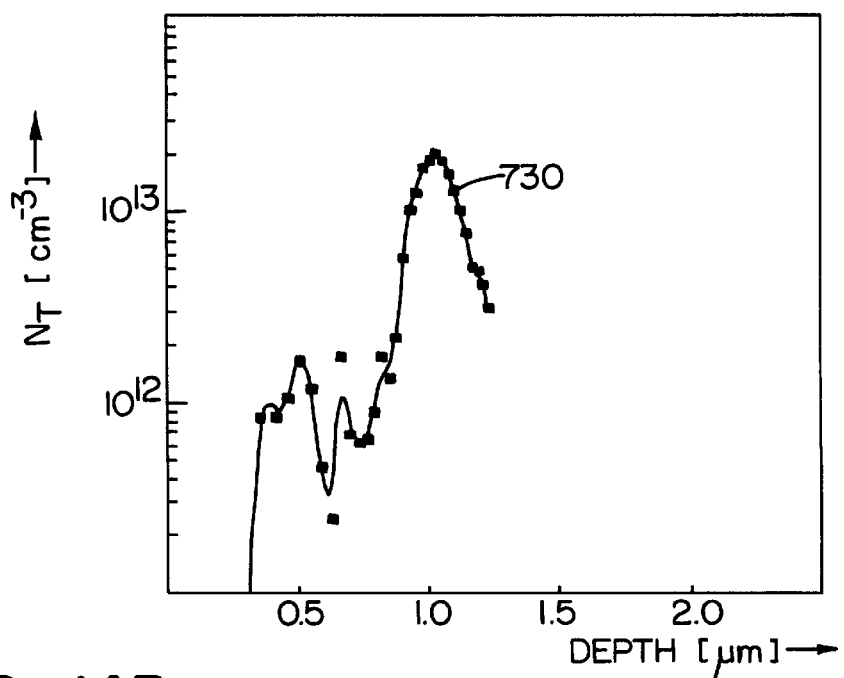

FIG. 14A shows the shallow acceptor concentration depth profile 720 in p-ype silicon wafers after bias annealing at 120° C. for 10 minutes, with a minimum at a depth between about 1.0 micron and 1.5 microns. FIG. 14B shows the copper—copper pair trap concentration depth profile 730 in p-type silicon wafers after bias annealing at 120° C. for 10 minutes, with a maximum at a depth of about 1.0 micron. In FIG. 14A, depth is plotted in microns along the abscissa and concentration (of shallow acceptors) is plotted in atoms/cm$^3$ along the ordinate. In FIG. 14B, depth is plotted in microns along the abscissa and concentration (of traps) is plotted in traps/cm$^3$ along the ordinate. FIGS. 14A and 14B compare the distribution profiles of both the shallow acceptors 720 and copper—copper pairs 730. It can be seen that the position of a valley in the acceptor concentration formed after bias annealing coincides well with that of copper—copper pairs as revealed, e.g., by depth-dependent deep level transient spectroscopy measurements.

(5) Characterization of Lateral Distribution of Copper Across Silicon Wafer (Copper Mapping)

Simultaneous application of a reverse bias to several Schottky diodes during annealing of an intentionally Cu contaminated wafer makes it possible to determine the lateral distribution of copper in the wafer near surface region.

Figure 15:
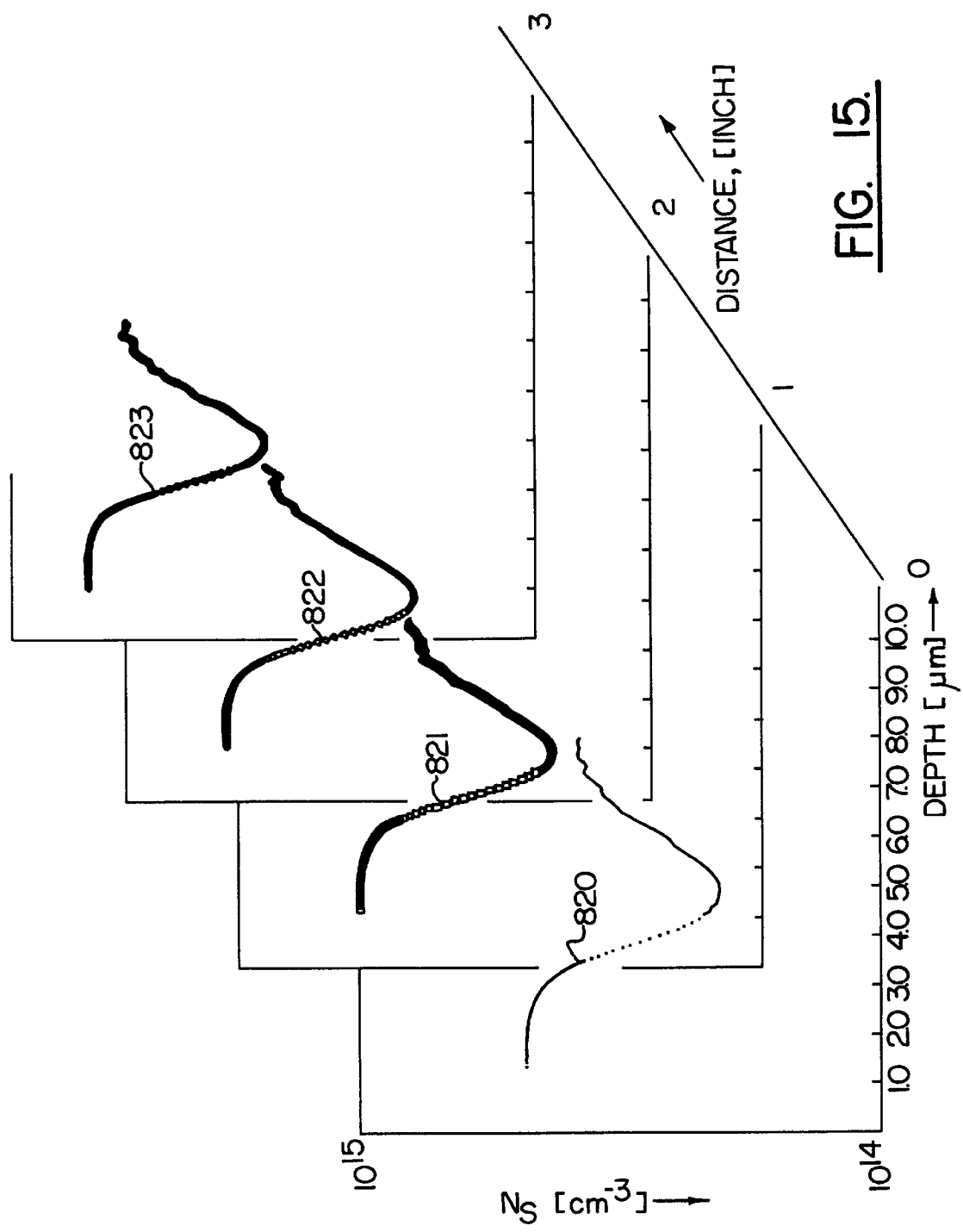
FIG. 15 Shallow acceptor depth profiles as measured on Schottky diodes located at different distances from the wafer center. A reverse bias of 5 V was applied to all of the diodes at 120° C. for 5 min.

FIG. 15 demonstrates the data obtained on the Schottky diodes located at different distances from the center of the wafer. In FIG. 15, depth is plotted in microns along the abscissas, concentration is plotted in atoms/cm$^3$ along the ordinates, and distance from the center of the wafer is plotted in inches along a dimension orthogonal to both the abscissas and the ordinates. Shallow acceptor concentration depth profiles 820–823 were measured on Schottky diodes located at 0, 1, 2 and 3 inches, respectively, from the center of the wafer, with a reverse bias of 5 V applied to all of the Schottky diodes at 120° C. for 5 minutes. The valley in shallow acceptor concentration depth profile 820 has a minimum at about 5.0 microns, whereas the minimum in the valley of shallow acceptor concentration depth profile 823 appears at about 4.0 microns.

Figure 16:
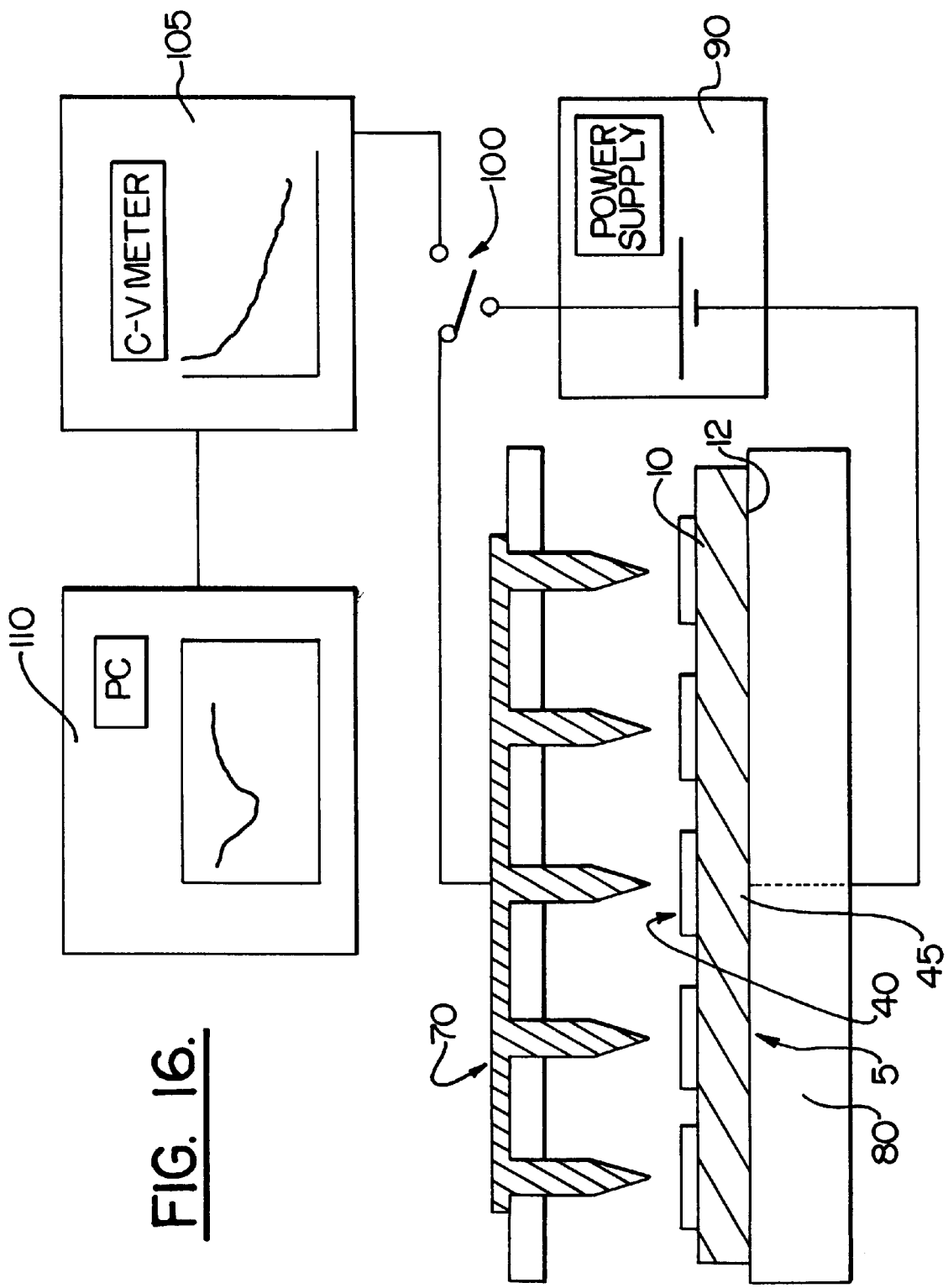
FIG. 16 Schematic presentation of the experimental set-up for bias annealing of Schottky diodes.

FIG. 16 schematically shows an experimental arrangement for bias annealing Schottky diodes 40 on a surface 10 of a copper-contaminated silicon wafer 5. For example, Schottky diodes 40 may be biased by a power supply 90 (e.g., positively), using switch 100 and an ohmic contact 45 on the back side 12 of silicon wafer 5, during annealing at a preselected temperature (e.g., 120° C.) for a predetermined amount of time (e.g., 5 min), using a specially designed multi-probe head 70 with silicon wafer 5 disposed on a hot plate 80. The multi-probe head 70 may be connected to a capacitance-voltage analyzer 105 through switch 100 so that when multi-probe head 70 contacts Schottky diodes 40 capacitance-voltage measurements can be made and processed by processor 110 to output concentration depth profiles. For example, processor 110 may output shallow acceptor concentration depth profiles which can be further processed by processor 110 to yield bulk copper concentrations and also surface copper concentrations on surface 10 of silicon wafer 5 and in the near-surface regions of silicon wafer 5.

4. Experimental Procedure for Determination of Copper Contamination on the Wafer Surface and in the Near-Surface Region An embodiment of the present invention experimental method for determination of copper contamination is now described. The major fundamental properties of copper have been described above. The thermal budget, i.e., the time and temperature, which is needed for the copper surface contamination to be driven into a desired depth below the surface has been chosen based on the copper diffusivity data and copper-boron pair dissociation/re-association kinetics. It is important to take into account the probability of surface cross-contamination with various metal impurities, i.e., Fe or Cr. These impurities are known to be positively charged and to form pairs with negatively charged boron.

Table 4 presents the 1 hour diffusion lengths (in microns, $\mu$m) for various impurities as a function of annealing temperature. It can be seen from this data that the copper impurity will leave behind any cross-contaminating impurity during short thermal annealing at relatively low temperatures, as shown, e.g., by comparing diffusion lengths for various metals in the range from 100° C. to 150° C.

TABLE 4

One Hour Diffusion Length for Metallic Impurities in Silicon (in microns $\mu$m)

| | Temp. (° C.) | Cu | Ni | Fe | Au | Cr | Co | Ti |
|---|---|---|---|---|---|---|---|---|
| 1 | 100 | 5.2e+01 | 1.8e+00 | 6.6e−01 | 2.2e+01 | 1.1e−02 | 2.4e−11 | 2.1e−07 |
| 2 | 110 | 6.2e+01 | 2.2e+00 | 7.4e−01 | 2.6e+01 | 1.6e−02 | 7.4e−11 | 3.8e−07 |
| 3 | 120 | 7.3e+01 | 2.6e+00 | 9.6e−01 | 3.0e+01 | 2.4e−02 | 2.2e−10 | 6.7e−07 |
| 4 | 130 | 8.5e+01 | 3.1e+00 | 1.2e+00 | 3.4e+01 | 3.4e−02 | 6.1e−10 | 1.2e−06 |
| 5 | 140 | 9.9e+01 | 3.7e+00 | 1.6e+00 | 3.9e+01 | 4.9e−02 | 1.6e−09 | 2.0e−06 |
| 6 | 150 | 1.1e+02 | 4.3e+00 | 2.0e+00 | 4.5e+01 | 6.8e−02 | 4.1e−09 | 3.2e−06 |
| 7 | 160 | 1.3e+02 | 5.0e+00 | 2.4e+00 | 5.0e+01 | 9.3e−02 | 9.9e−09 | 5.2e−06 |
| 8 | 170 | 1.5e+02 | 5.8e+00 | 3.0e+00 | 5.7e+01 | 1.3e−01 | 2.3e−08 | 8.2e−06 |
| 9 | 180 | 1.7e+02 | 6.6e+00 | 3.6e+00 | 6.3e+01 | 1.7e−01 | 5.2e−08 | 1.3e−05 |
| 10 | 190 | 1.9e+02 | 7.5e+00 | 4.4e+00 | 7.1e+01 | 2.2e−01 | 1.1e−07 | 1.9e−05 |
| 11 | 200 | 2.1e+02 | 8.5e+00 | 5.2e+00 | 7.8e+01 | 2.9e−01 | 2.3e−07 | 2.8e−05 |
| 12 | 210 | 2.4e+02 | 9.6e+00 | 6.2e+00 | 8.7e+01 | 3.7e−01 | 4.8e−07 | 4.1e−05 |
| 13 | 220 | 2.6e+02 | 1.1e+01 | 7.3e+00 | 9.5e+01 | 4.7e−01 | 9.4e−07 | 6.0e−05 |
| 14 | 230 | 2.9e+02 | 1.2e+01 | 8.6e+00 | 1.0e+02 | 6.0e−01 | 1.8e−06 | 8.5e−05 |
| 15 | 240 | 3.2e+02 | 1.3e+01 | 1.0e+01 | 1.1e+02 | 7.5e−01 | 3.4e−06 | 1.2e−04 |
| 16 | 250 | 3.5e+02 | 1.5e+01 | 1.2e+01 | 1.2e+02 | 9.3e−01 | 6.2e−06 | 1.6e−04 |
| 17 | 260 | 3.8e+02 | 1.6e+01 | 1.3e+01 | 1.3e+02 | 1.1e+00 | 1.1e−05 | 2.2e−04 |
| 18 | 270 | 4.2e+02 | 1.8e+01 | 1.5e+01 | 1.5e+02 | 1.4e+00 | 1.9e−05 | 3.0e−04 |
| 19 | 280 | 4.6e+02 | 2.0e+01 | 1.7e+01 | 1.6e+02 | 1.7e+00 | 3.3e−05 | 4.0e−04 |
| 20 | 290 | 4.9e+02 | 2.1e+01 | 2.0e+01 | 1.7e+02 | 2.0e+00 | 5.6e−05 | 5.3e−04 |
| 21 | 300 | 5.3e+02 | 2.3e+01 | 2.2e+01 | 1.8e+02 | 2.4e+00 | 9.3e−05 | 7.0e−04 |
| 22 | 310 | 5.7e+02 | 2.5e+01 | 2.5e+01 | 1.9e+02 | 2.9e+00 | 1.5e−04 | 9.0e−04 |
| 23 | 320 | 6.2e+02 | 2.7e+01 | 2.8e+01 | 2.1e+02 | 3.4e+00 | 2.4e−04 | 1.2e−03 |

TABLE 4-continued

One Hour Diffusion Length for Metallic Impurities in Silicon (in microns $\mu$m)

| | Temp. (° C.) | Cu | Ni | Fe | Au | Cr | Co | Ti |
|---|---|---|---|---|---|---|---|---|
| 24 | 330 | 6.6e+02 | 2.9e+01 | 3.2e+01 | 2.2e+02 | 4.0e+00 | 3.8e−04 | 1.5e−03 |
| 25 | 340 | 7.1e+02 | 3.2e+01 | 3.5e+01 | 2.3e+02 | 4.7e+00 | 5.9e−04 | 1.9e−03 |
| 26 | 350 | 7.5e+02 | 3.4e+01 | 3.9e+01 | 2.5e+02 | 5.5e+00 | 9.0e−04 | 2.4e−03 |
| 27 | 360 | 8.0e+02 | 3.6e+01 | 4.3e+01 | 2.6e+02 | 6.4e+00 | 1.4e−03 | 2.9e−03 |
| 28 | 370 | 8.5e+02 | 3.9e+01 | 4.7e+01 | 2.8e+02 | 7.3e+00 | 2.0e−03 | 3.6e−03 |
| 29 | 380 | 9.1e+02 | 4.1e+01 | 5.2e+01 | 2.9e+02 | 8.4e+00 | 3.0e−03 | 4.5e−03 |
| 30 | 390 | 9.6e+02 | 4.4e+01 | 5.7e+01 | 3.1e+02 | 9.6e+00 | 4.3e−03 | 5.5e−03 |
| 31 | 400 | 1.0e+03 | 4.7e+01 | 6.2e+01 | 3.2e+02 | 1.1e+01 | 6.2e−03 | 6.6e−03 |
| 32 | 410 | 1.1e+03 | 5.0e+01 | 6.8e+01 | 3.4e+02 | 1.2e+01 | 8.9e−03 | 8.0e−03 |
| 33 | 420 | 1.1e+03 | 5.3e+01 | 7.4e+01 | 3.6e+02 | 1.4e+01 | 1.2e−02 | 9.6e−03 |
| 34 | 430 | 1.2e+03 | 5.6e+01 | 8.0e+01 | 3.7e+02 | 1.6e+01 | 1.7e−02 | 1.2e−02 |
| 35 | 440 | 1.3e+03 | 5.9e+01 | 8.6e+01 | 3.9e+02 | 1.8e+01 | 2.4e−02 | 1.4e−02 |
| 36 | 450 | 1.3e+03 | 6.2e+01 | 9.3e+01 | 4.1e+02 | 2.0e+01 | 3.3e−02 | 1.6e−02 |
| 37 | 460 | 1.4e+03 | 6.5e+01 | 1.0e+02 | 4.3e+02 | 2.2e+01 | 4.5e−02 | 1.9e−02 |
| 38 | 470 | 1.4e+03 | 6.9e+01 | 1.1e+02 | 4.4e+02 | 2.5e+01 | 6.0e−02 | 2.2e−02 |
| 39 | 480 | 1.5e+03 | 7.2e+01 | 1.2e+02 | 4.6e+02 | 2.7e+01 | 8.0e−02 | 2.6e−02 |
| 40 | 490 | 1.6e+03 | 7.6e+01 | 1.2e+02 | 4.8e+02 | 3.0e+01 | 1.1e−01 | 3.0e−02 |
| 41 | 500 | 1.6e+03 | 7.9e+01 | 1.3e+02 | 5.0e+02 | 3.3e+01 | 1.4e−01 | 3.5e−02 |
| 42 | 510 | 1.7e+03 | 8.3e+01 | 1.4e+02 | 5.2e+02 | 3.7e+01 | 1.8e−01 | 4.1e−02 |
| 43 | 520 | 1.8e+03 | 5.7e+01 | 1.5e+02 | 5.4e+02 | 4.0e+01 | 2.4e−01 | 4.7e−02 |
| 44 | 530 | 1.8e+03 | 9.0e+01 | 1.6e+02 | 5.6e+02 | 4.4e+01 | 3.1e−01 | 5.4e−02 |
| 45 | 540 | 1.9e+03 | 9.4e+01 | 1.7e+02 | 5.8e+02 | 4.8e+01 | 3.9e−01 | 6.1e−02 |
| 46 | 550 | 2.0e+03 | 9.8e+01 | 1.8e+02 | 6.0e+02 | 5.3e+01 | 5.0e−01 | 7.0e−02 |
| 47 | 560 | 2.1e+03 | 1.0e+02 | 1.9e+02 | 6.2e+02 | 5.7e+01 | 6.4e−01 | 7.9e−02 |

Figure 17:
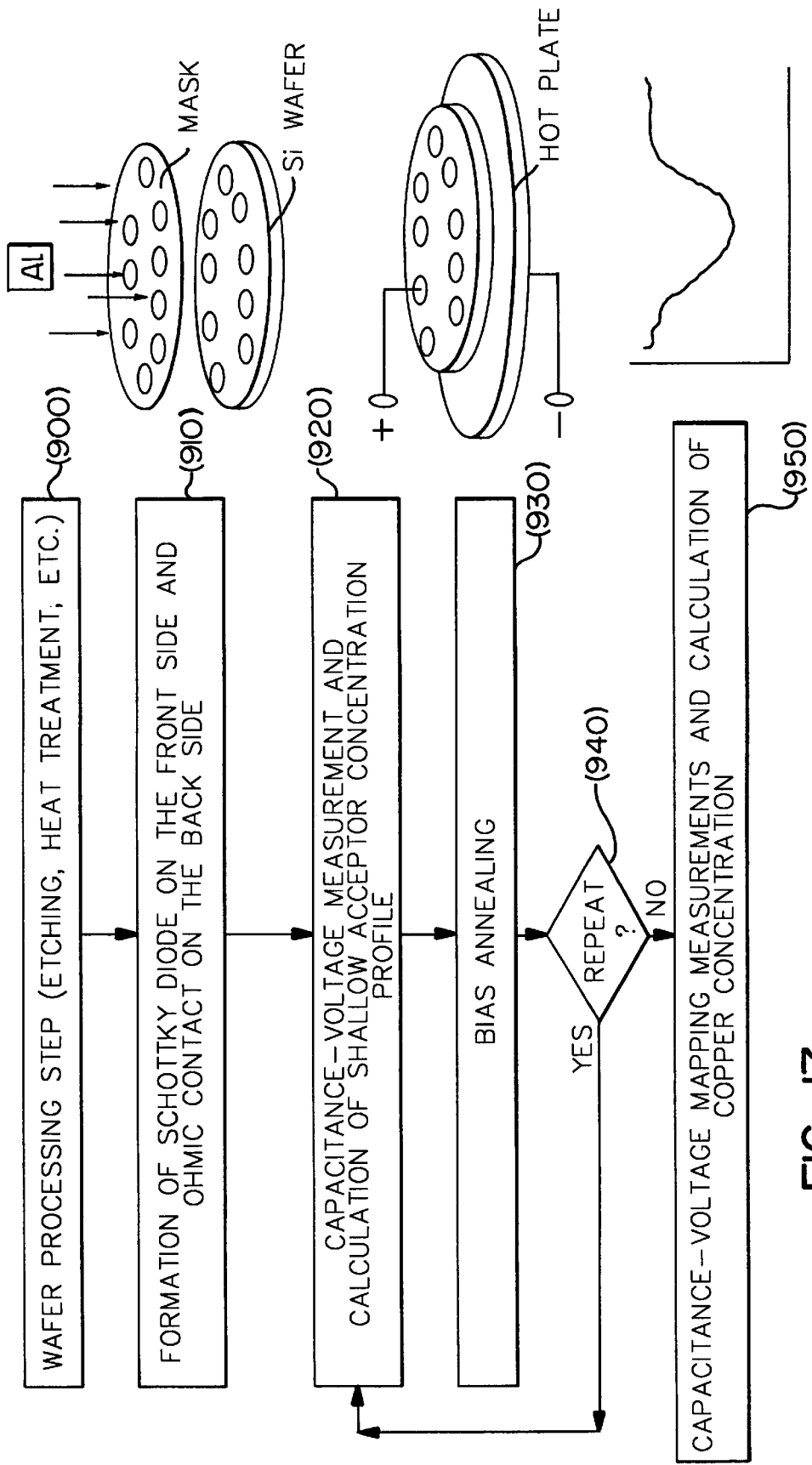
FIG. 17 Flow chart for experimental procedures to detect copper contamination in a p-type silicon wafer.

FIG. 17 shows schematically in a flow chart the steps in an embodiment of the present invention method. The flow chart takes into account all the fundamental and technical aspects discussed above, including an additional option for mapping the copper lateral distribution. A procedure for preferred embodiments of the present invention method for determining the copper concentration on a silicon wafer surface and in a near-surface region of the silicon wafer may be summarized as follows:

(a) subject a p-type wafer to a chemical treatment of interest (which may depend on the specific objective, e.g., it might be subjecting the wafer to either surface cleaning or a contaminating environment), at step (900);

(b) fabricate Schottky diodes by depositing aluminum, titanium or samarium through a mask, and form an ohmic contact on the back side of a high resistivity silicon wafer by either deposition of gold or by rubbing an indium-gallium paste, at step (910);

(c) put the wafer onto a probe station for capacitance-voltage measurements, and vary the reverse bias during the capacitance-voltage test (e.g., from about 0 V to greater than about 10 V), at step (920);

(d) put the wafer on a hot plate (made of an appropriate conductive material, such as, e.g., stainless steel chucks) and apply a reverse bias to the Schottky diodes using a multi-probe head (the recommended annealing conditions are:

| annealing temperature | 120° C. |
|---|---|
| annealing time | 5 min |
| reverse voltage | 5 to 10 V), at step (930); |

(e) remove the wafer from the hot plate and determine, at step (940), whether to repeat the capacitance-voltage measurements, and, if so, put the wafer again onto a probe station to repeat capacitance-voltage measurements (a suitable apparatus for copper mapping includes, e.g., a commercially available automated probe station), as at step (920), unless, or until, it is determined, at step (940), not to repeat the capacitance-voltage measurement; and (f) calculate the total loss of the acceptor concentration by integrating over the thickness of a valley in the acceptor concentration profile, and then normalizing the integrated value to a 1 micron thick layer and then converting to either bulk or surface concentrations, at step (950).

The in situ capacitance-voltage measurements of one Schottky diode may be carried out at the temperature of the bias annealing. In such a case, a hot plate may be combined with a probe station.

It will, of course, be understood that modifications of the present invention, in its various aspects, will be apparent to those skilled in the art, some being apparent only after study, others being matters of routine mechanical, chemical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A method for detecting at least one transition metal at a surface and subsurface region of a silicon wafer, the method comprising the steps of:

a) providing bias annealing on said silicon wafer to cause the ions of said at least one transition metal to drift away from said surface and subsurface region; and b) performing capacitance-voltage measurements based on the result of said ion drifting caused by said bias annealing to determine a concentration of said at least one transition metal at said surface and subsurface region.

2. The method as defined in claim 1 including the step of forming at least one Schottky diode on said surface of said silicon wafer.

3. The method as defined in claim 2 including the step of forming an ohmic contact at an opposite surface of said silicon wafer.

4. The method as defined in claim 2 including the step of applying a reverse bias to said at least one Schottky diode.

5. The method as defined in claim 4 including the step of varying said reverse bias during said capacitance-voltage measurements.

6. The method as defined in claim 5, wherein said reverse bias is about 2 V to about 18 V.

7. The method as defined in claim 1, wherein said annealing is performed at about 20° C. to about 200° C.

8. The method as defined in claim 2 wherein said at least one Schottky diode is formed through a deposition process.

9. The method as defined in claim 1, wherein said transition metal is copper.

10. A method as defined in claim 1 further comprising the steps of:
   forming at least one Schottky diode on said surface of said wafer; and
   performing initial capacitance-voltage measurements to calculate a shallow acceptor concentration.

11. The method as defined in claim 10 including the step of forming an ohmic contact at an opposite surface of said wafer.

12. The method as defined in claim 10 including the step of applying a reverse bias to said Schottky diode.

13. The method as defined in claim 12 including the step of varying said reverse bias during said capacitance-voltage measurements.

14. The method as defined in claim 13, wherein said reverse bias is about 2 V to about 18 V.

15. The method as defined in claim 10, wherein said annealing performed at about 20° C. to about 200° C.

16. The method as defined in claim 10 wherein said at least one Schottky diode is formed through a deposition process.

17. The method as defined in claim 10, wherein said transition metal is copper.

18. A method as defined in claim 1 for detecting copper at said surface and subsurface regions of a p-type single crystal silicon wafer, the method comprising the further steps of:
   forming a plurality of Schottky diodes on said surface of said wafer;
   forming at least one ohmic contact on an opposite surface of said wafer; and
   performing capacitance-voltage measurements to calculate a shallow acceptor concentration profile; and
   wherein said bias annealing step comprises the steps of:
      placing said wafer onto a hot plate made of conductive material with sufficiently high temperature to cause copper-boron pair dissociation which releases copper ions; and
      applying a first reverse bias to said plurality of Schottky diodes to create a driving force to cause said copper ions to drift along an electric field established by said first reverse bias and away from said surface of said wafer; and
   wherein the method further comprises the steps of:
      removing said water from said hot plate and repeating said capacitance-voltage measurements; and
      determining a copper concentration at said surface and subsurface region of said wafer.

19. The method as defined in claim 18 including the step of applying a second reverse bias during said capacitance-voltage measurements.

20. The method as defined in claim 19 including the step of varying said second reverse bias during said capacitance-voltage measurements.

21. The method as defined in claim 20, wherein said reverse bias is about 2 V to about 18 V.

22. The method as defined in claim 18, wherein said annealing performed at about 20° C. to about 200° C.

23. The method as defined in claim 18 wherein said plurality of Schottky diodes is formed through a deposition process.

24. The method as defined in claim 18 wherein said copper concentration at said surface and subsurface region of said wafer is determined by calculating a total loss of acceptor concentration by integrating over a thickness of a valley in said shallow acceptor concentration profile, and normalizing the integrated value.

* * * * *

UNITED STATES PATENT AND TRADEMARK OFFICE
CERTIFICATE OF CORRECTION

PATENT NO. : 5,943,552

DATED : August 24, 1999

INVENTOR(S) : Koveshnikov et al.

It is certified that error appears in the above-identified patent and that said Letters Patent is hereby corrected as shown below:

On the title page, [56] OTHER PUBLICATIONS, Column 2, line 25, after "Dieter" cancel the comma (,); page 2, column 1, line 4, "Edtion" should read --Edition--; line 15, "HP-Based" should read --HF-Based--.

Column 13, line 64, last line of Table 3, "13 X $10^{10} cm^{-3}$" should read --3 X $10^{10} cm^{-3}$--.

Column 17, Table 4, fourth column, line 20, "5.7e+01" should read --8.7e+01--.

Signed and Sealed this

First Day of February, 2000

Attest:

Q. TODD DICKINSON

*Attesting Officer*  *Acting Commissioner of Patents and Trademarks*